(12) United States Patent
Yamasaki et al.

(10) Patent No.: US 7,035,128 B2
(45) Date of Patent: Apr. 25, 2006

(54) SEMICONDUCTOR MEMORY DEVICE AND SEMICONDUCTOR INTEGRATED CIRCUIT DEVICE

(75) Inventors: Yuji Yamasaki, Osaka (JP); Masanobu Hirose, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 160 days.

(21) Appl. No.: 10/734,296

(22) Filed: Dec. 15, 2003

(65) Prior Publication Data
US 2004/0136219 A1    Jul. 15, 2004

(30) Foreign Application Priority Data
Dec. 27, 2002   (JP) ............................ 2002-379239

(51) Int. Cl.
*G11C 5/00*    (2006.01)
(52) U.S. Cl. .................... 365/59; 365/149; 365/189.08
(58) Field of Classification Search ................. 365/59, 365/149, 189.08
See application file for complete search history.

(56) References Cited

U.S. PATENT DOCUMENTS

| 5,148,393 | A |   | 9/1992  | Furuyama |
|-----------|---|---|---------|----------|
| 5,555,206 | A |   | 9/1996  | Uchida |
| 5,872,737 | A | * | 2/1999  | Tsuruda et al. ........ 365/189.05 |
| 6,088,286 | A | * | 7/2000  | Yamauchi et al. ..... 365/230.06 |
| 6,631,092 | B1| * | 10/2003 | Yamasaki .................... 365/201 |
| 6,781,915 | B1| * | 8/2004  | Arimoto et al. ....... 365/230.03 |

FOREIGN PATENT DOCUMENTS

JP    2002-522871 A    7/2002
WO   WO 00/10171      2/2000

* cited by examiner

*Primary Examiner*—Connie C. Yoha
(74) *Attorney, Agent, or Firm*—McDermott Will & Emery LLP

(57) ABSTRACT

In a DRAM memory cell including an access Tr and a cell capacitor, a depletion type MOSFET is used for each of the access Tr and the cell capacitor. Thus, an operation margin can be increased and the number of necessary power supplied can be reduced, compared to a known DRAM.

32 Claims, 14 Drawing Sheets

SEMICONDUCTOR MEMORY DEVICE AND SEMICONDUCTOR INTEGRATED CIRCUIT DEVICE

BACKGROUND OF THE INVENTION

The present invention relates to semiconductor memory devices, and more particularly relates to a dynamic semiconductor memory device formed using a logic process and a semiconductor integrated circuit device in which the dynamic semiconductor memory device is placed with a logic circuit.

Dynamic semiconductor memory devices (DRAMs) which have been used in recent years have increased capacity and a reduced size while driving voltage of the DRAMs has been reduced to be almost 1 V. More specifically, the driving voltage of a DRAM of the 0.18 μm process generation is 1.8 V, that of the 0.15 μm is 1.5 V, and, furthermore, that of the 0.13 μm generation is 1.2 V.

Under such circumstances, in order to ensure an operation margin at a low voltage, various measures have been taken in forming a DRAM circuit. For example, in a DRAM including a transistor and a capacitor (i.e., a DRAM of the 1T1C structure) or a DRAM of an NMOS memory cell type, the threshold voltage (which will be herein referred to as "Vt") of an access transistor (which will be herein referred to as an "access Tr") is set to be higher than that of Tr in a regular logic transistor or an peripheral circuit to reduce leakage current, the voltage of a word line is increased to maximize the quantity of electric charge written onto a memory cell, or like measures are taken. In this case, when the potential of a word line is increased, the potential is increased to be higher than a power supply voltage by the threshold voltage of the access Tr or more. Note that in this structure, it is necessary to use a transistor in which a thick gate oxide film is used or to take like measures so that the access Tr resists an increased potential.

These bias structures have been widely used for the purpose of ensuring operation margins for recent DRAMs of the megabit-class or more. Moreover, a structure in which the potential of part of a substrate located in a memory cell region is set to be negative for the purpose of achieving reduction in leakage current in an access Tr, suppression of influence of the substrate bias effect or the like has been widely used.

Furthermore, as for recent system LSIs, the technique of forming a DRAM using a logic process is one of techniques particularly drawing attention. For example, an example of the technique is described in National Publication of Translated Version No. 2002-522871 filed in the name of "On-chip word line voltage generation for DRAM embedded in logic process". FIG. 16 is a circuit diagram illustrating the configuration of a memory cell of a DRAM in the case where the DRAM is formed using a logic process.

The DRAM of FIG. 16 includes a word line 1001 and a bit line 1002 intersecting with each other and a memory cell provided around the intersection of the word line 1001 and the bit line 1002. The memory cell includes a p-channel MOSFET, i.e., an access transistor (access Tr) 1003 in which the word line 1001 is connected to a gate electrode and which has a terminal connected to the bit line 1002, and another p-channel MOSFET, i.e., a cell capacitor 1004 which is connected to the other terminal of the access Tr 1003 and functions as a capacitor. The cell capacitor 1004 includes a cell plate electrode 1006. The potential of the cell plate 1006 is a first negative increased potential $V_{BB1}$ (0 V>$V_{BB1}$). Moreover, the potential of a substrate shared by the access Tr and the cell capacitor 1004 or a well electrode 1005 is a first increased potential $V_{PP1}$.

In a DRAM formed using the above-described logic process, a cell capacitor and an access Tr are formed of MOS transistors having the same structure as that used for a logic gate. In addition, the following contrivance has been made in a word line, a cell plate, a bias structure of a substrate potential (well potential) for the purpose of achieving both of an increased operation margin of the DRAM (specifically, at a low voltage operation) and charge holding properties.

First, the potential of the word line 1001 in an activated state is set to be a second increased potential $V_{pp2}$ which is higher than the power supply potential $V_{DD}$ and an amount of charge written on a memory cell storage node 1007 is maximized to ensure an operation margin. Moreover, the potential of the word line 1001 in a non-activated state is set to be a second negative increased potential $V_{BB2}$ which is lower than the ground potential $V_{SS}$, so that a leakage current from the access Tr 1003 is reduced. Furthermore, the substrate potential of the access Tr 1003 is also set to be the first increased potential $V_{PP1}$ (>$V_{DD}$), so that leakage current is suppressed. Using these methods, charge retention characteristics of a memory cell can be improved.

Moreover, the potential of the cell plate electrode 1006 is set to be $V_{BB1}$(<$V_{SS}$) to keep the cell capacitor 1004 in a state where a channel is formed at all the time. Thus, the cell capacitance of the cell capacitor 1004 is not dependent on a write potential onto the memory cell storage node 1007 from the bit line 1002, but is stably ensured.

As has been described, in the known DRAM formed using a logic process, the potential of a word line is increased in an activated state and is negatively increased in a non-activated state. Moreover, by negatively increasing the cell plate potential and, furthermore, by increasing the substrate potential, desired characteristics of a memory cell are ensured.

If the structure of the above-described DRAM is used, an operation margin is increased and leakage current can be also reduced. However, in order to perform a storing operation in the known DRAM, besides to the power supply potential $V_{DD}$ and the ground potential $V_{SS}$, four bias voltage sources, i.e., second negative increased potential $V_{BB2}$ and second increased potential $V_{PP2}$ for a word line, a bias potential for a cell plate electrode $V_{BB1}$, and an increased potential $V_{PP1}$ for a substrate (well) bias, are required. Thus, the same number of circuits for bias or power supply circuits as the number of the bias voltages have to be provided in a chip. Moreover, for a bias of a word line, a driver circuit for controlling two biases, i.e., $V_{PP2}$ (>$V_{DD}$) and $V_{BB2}$ (<$V_{SS}$) is needed. If this structure is formed, a circuit configuration becomes complex and, moreover, a bias circuit and a driver circuit are needed. Therefore, a disadvantage of largely increasing the chip area of an LSI is caused.

SUMMARY OF THE INVENTION

An object of the present invention is to provide a semiconductor memory device which is operable even if a power supply voltage is reduced due to reduction in device size, can be formed in a simple structure, and also can be fabricated using a logic process in a simple manner.

A first semiconductor memory device according to the present invention includes: a word line; a first bit line intersecting with the word line; a second bit line forming a bit line pair with the first bit line; a memory cell including an access transistor of an MISFET in which a gate electrode is connected to the word line and a first doped layer is connected to the first bit line, and a cell capacitor connected to a second doped layer of the access transistor, being capable of storing electric charge, and located at the intersection between the word line and the first bit line; and a sense amplifier for amplifying a potential difference between the first bit line and the second bit line during a read-out operation. In the semiconductor memory device, a positive power supply voltage is applied to the first bit line in a high level state and a ground voltage is applied to the first bit line in a low level state, the access transistor is a depletion type p-channel MISFET, and the ground voltage is applied to a gate electrode of the access transistor through the word line when the memory cell is in an activated state.

Thus, an operation margin for the access transistor can be increased, compared to the known DRAM. Therefore, for example, even if a driving voltage (a positive power supply voltage) is reduced to 1.5 V or less due to device size reduction, a stable operation can be performed. Moreover, it is no longer necessary to apply a negative voltage to a gate electrode of the access transistor when the memory cell is in an activated state. Thus, the number of power supply circuits or circuits for bias can be reduced. Therefore, it is possible to reduce a circuit area while simplifying circuit control.

An increased potential higher than the positive power supply voltage may be applied to the gate electrode of the access transistor in a non-activated state.

Moreover, if the cell capacitor is a p-channel MISFET, the cell capacitor can be formed in the same process step in which the access transistor is formed. It becomes also possible to fabricate the semiconductor memory device using a logic process. Therefore, when the semiconductor memory device is provided with a logic circuit, it is possible to reduce the number of process steps.

If the cell capacitor is a planar type MISFET, the cell capacitor can be formed in a more simple manner.

If the cell capacitor is a depletion type MISFET and during an operation period, the ground voltage is applied to the gate electrode of the cell capacitor, a negative increased potential supply source which has been needed in the known DRAM is no longer necessary. Therefore, it is possible to reduce a circuit area while simplifying circuit control.

If the access transistor and the cell capacitor share a substrate or an n-type well to which the positive power supply voltage is applied and the positive power supply voltage is applied to the first bit line in a high level state and the ground voltage is applied to the first bit line in a low level state, the substrate bias effect in the access Tr and the cell capacitor can be lower (i.e., depletion can be ensured to be stable) than that when an increased voltage is applied to the substrate or the n-type well. Moreover, an operation margin for the access transistor can be ensured. That is to say, a storing operation can be achieved with a less number of power supplies than that in the known DRAM.

If the sense amplifier includes: an amplifier circuit which includes a pair of p-channel MISFETs and amplifies a potential difference between the pair of bit lines; and a p-channel drive MIS transistor which controls driving of the amplifier circuit and has a lower threshold voltage than that of the pair of p-channel MISFETs, leakage current from the p-channel drive MISFET can be suppressed while an operation margin of the pair of p-channel MISFETs can be increased to be larger than that in the known sense amplifier. Therefore, operation performance can be improved.

If each of the pair of p-channel MISFETs is a depletion type MISFET, an operation margin for the sense amplifier can be further increased.

If the first semiconductor memory device further includes a precharging/equalizing circuit including: a bit line equalizing transistor of a depletion type p-channel MISFET for short-circuitting between the first bit line and the second bit line during a period in which the memory cell is in a non-activated state; and a bit line precharging transistor of depletion type p-channel MISFET for applying a constant voltage to the bit line pair during a period in which the memory cell is in a non-activated state, an operation margin for the precharging/equalizing circuit can be increased. Therefore, when operation margins for the memory cell and the sense amplifier are sufficiently large, operation performance can be improved.

If a voltage higher than a threshold voltage is applied to each gate electrode of the bit line equalizing transistor and the bit line precharging transistor during a period in which the memory cell is in a non-activated state, the potential of the bit line pair can be kept at a predetermined level during a period in which the memory cell is in a non-activated state.

If the access transistor, the bit line equalizing transistor, the bit line precharging transistor and the pair of p-channel MISFETs in the sense amplifier are formed in the process step, the number of process steps can be reduced. Therefore, fabrication costs can be reduced.

A second semiconductor memory device according to the present invention includes: a word line; a first bit line intersecting with the word line; a second bit line forming a bit line pair with the first bit line; a memory cell including an access transistor of an MISFET in which a gate electrode is connected to the word line and a first doped layer is connected to the first bit line, and a cell capacitor connected to a second doped layer of the access transistor, being capable of storing electric charge, and located at the intersection between the word line and the first bit line; and a sense amplifier for amplifying a potential difference between the first bit line and the second bit line during a read-out operation. In the semiconductor memory device, a positive power supply voltage is applied to the first bit line in a high level state and a ground voltage is applied to the first bit line in a low level state, the access transistor is a depletion type n-channel MISFET, and the positive voltage is applied to a gate electrode of the access transistor through the word line when the memory cell is in an activated state.

Thus, an operation margin for the access transistor can be increased, compared to the known DRAM. Therefore, for example, even if a driving voltage (a positive power supply voltage) is reduced to 1.5 V or less due to device size reduction, a stable operation can be performed. Moreover, it is no longer necessary to apply a negative voltage to a gate electrode of the access transistor when the memory cell is in an activated state. Thus, the number of power supply circuits or circuits for bias can be reduced. Therefore, it is possible to reduce a circuit area while simplifying circuit control.

A negative increased potential lower than the ground voltage may be applied to the gate electrode of the access transistor in a non-activated state.

If the cell capacitor is an n-channel MISFET, it becomes possible to fabricate the semiconductor memory device using a logic process. Therefore, when the semiconductor memory device is provided together with a logic circuit, it is possible to reduce the number of process steps.

If the cell capacitor is a planar type MISFET, the cell capacitor can be formed in a more simple manner.

If the cell capacitor is a depletion type MISFET, and during an operation period, the positive power supply voltage is applied to the gate electrode of the cell capacitor, it becomes possible to make the cell capacitor to store electric charge with a less number of power supplies that in the known DRAM.

If the access transistor and the cell capacitor share a substrate or a p-type well to which the positive power supply voltage is applied, and the positive power supply voltage is applied to the first bit line in a high level state and the ground voltage is applied to the first bit line in a low level state, it becomes possible to make the cell capacitor to store electric charge even when a negative voltage is not applied to the substrate or the p-type well. Moreover, an operation margin for the access transistor can be ensured. That is to say, a storing operation can be achieved with a less number of power supplies than that in the known DRAM.

If the sense amplifier includes: an amplifier circuit which includes a pair of n-channel MISFETs and amplifies a potential difference between the pair of bit lines; and an n-channel drive MIS transistor which controls driving of the amplifier circuit and has a lower threshold voltage than that of the pair of n-channel MISFETs, leakage current from the n-channel drive MISFET can be suppressed while an operation margin of the pair of n-channel MISFETs can be increased to be larger than that in the known sense amplifier. Therefore, operation performance can be improved.

Each of the pair of n-channel MISFETs may be a depletion type MISFET.

If the second semiconductor memory device further includes a precharging/equalizing circuit including: a bit line equalizing transistor of a depletion type p-channel MISFET for short-circuitting between the first bit line and the second bit line during a period in which the memory cell is in a non-activated state; a bit line precharging transistor of depletion type n-channel MISFET for applying a constant voltage to the bit line pair during a period in which the memory cell is in a non-activated state, an operation margin for the precharging/equalizing circuit can be increased. Therefore, when operation margins for the memory cell and the sense amplifier are sufficiently large, operation performance can be improved.

If a voltage equal to or higher than a threshold voltage is applied to each gate electrode of the bit line equalizing transistor and the bit line precharging transistor during a period in which the memory cell is in a non-activated state, the potential of the bit line pair can be kept at a predetermined level during a period in which the memory cell is in a non-activated state.

If the access transistor, the bit line equalizing transistor, the bit line precharging transistor and the pair of n-channel MISFETs in the sense amplifier are formed in the process step, the number of process steps can be reduced.

A first semiconductor integrated circuit device according to the present invention includes: a logic circuit which includes a p-channel MISFET and is integrated on a substrate; and a dynamic semiconductor memory device provided on the substrate on which the logic circuit is provided and including a word line, a first bit line intersecting with the word line, a second bit line forming a bit line pair with the first bit line, a memory cell including an access transistor of a p-channel MISFET in which a gate electrode is connected to the word line and a first doped layer is connected to the first bit line, and a cell capacitor connected to a second doped layer of the access transistor, being capable of storing electric charge, and located at the intersection between the word line and the first bit line, and a sense amplifier for amplifying a potential difference between the first bit line and the second bit line during a read-out operation. In the semiconductor integrated circuit device the threshold voltage of the access transistor is set to be higher than that of the p-channel MISFET provided in the logic circuit.

Thus, the threshold voltage of the logic circuit can be set to be low, so that operation speed can be improved. And at the same time, in the semiconductor memory device, an operation margin for the access transistor can be increased to ensure operation performance at a low voltage.

More specifically, if the access transistor is a depletion type MISFET, and the ground voltage is applied to a gate electrode of the access transistor through the word line when the memory cell is in an activated state, the number of necessary power supplies can be reduced, compared to the known semiconductor integrated circuit device. Therefore, operation control can be performed in a simple manner and a circuit area can be reduced.

If the cell capacitor is a p-channel MISFET, the semiconductor memory device can be formed in the same process step in which the logic circuit is formed. Therefore, fabrication costs can be reduced.

If the cell capacitor is a planar type MISFET, the cell capacitor can be formed in a more simple manner.

If the cell capacitor is a depletion type MISFET, and during an operation period, the ground voltage is applied to the gate electrode of the cell capacitor, it becomes possible to make the cell capacitor to stably store electric charge with a less number of power supplies that in the known semiconductor integrated circuit device.

If the access transistor includes a gate insulation film having a greater thickness than the thickness of a gate insulation film of the p-channel MISFET in the logic circuit, gate leakage current can be suppressed. Therefore, data can be stored more stably.

If the thickness of the gate insulation film of the access transistor is equal to the thickness of a gate insulation film of the cell capacitor, the access transistor and the cell capacitor can be formed in the same process step. Therefore, the number of process steps can be further reduced.

If the access transistor and the cell capacitor share a substrate or an n-type well to which the positive power supply voltage is applied and the positive power supply voltage is applied to the first bit line in a high level state and the ground voltage is applied to the first bit line in a low level state, the number of necessary power supplies can be reduced to reduce a circuit area, compared to the known semiconductor integrated circuit device.

If the sense amplifier includes: an amplifier circuit which includes a pair of p-channel MISFETs and amplifies a potential difference between the pair of bit lines; and a p-channel drive MIS transistor which controls driving of the amplifier circuit and has a lower threshold voltage than that of the pair of p-channel MISFETs, an operation margin for the sense amplifier can be increased, compared to the known semiconductor integrated circuit device.

If each of the pair of p-channel MISFETs is a depletion type MISFET, an operation margin can be further increased.

If the first semiconductor memory device further includes a precharging/equalizing circuit including: a bit line equalizing transistor of a depletion type p-channel MISFET for short-circuitting between the first bit line and the second bit line during a period in which the memory cell is in a non-activated state; and a bit line precharging transistor of depletion type p-channel MISFET for applying a constant voltage to the bit line pair during a period in which the memory cell is in a non-activated state, the potential of the bit line pair in a non-activated state can be reliably set to be a predetermined level. Moreover, an operation margin for the precharging/equalizing circuit is increased, compared to the known semiconductor integrated circuit device. Therefore, when operation margins for the memory cell and the sense amplifier are sufficiently large, operation performance can be improved.

If a voltage higher than a threshold voltage is applied to each gate electrode of the bit line equalizing transistor and the bit line precharging transistor during a period in which the memory cell is in a non-activated state, the potential of the bit line pair in a non-activated state can be reliably set to be a predetermined level.

If part of a process step for forming the dynamic semiconductor memory device is performed simultaneously to part of a logic process step for forming the logic circuit, the number of process steps can be reduced.

A second semiconductor integrated circuit device according to the present invention includes: a logic circuit which includes a n-channel MISFET and is integrated on a substrate; and a dynamic semiconductor memory device provided on the substrate on which the logic circuit is provided and including a word line, a first bit line intersecting with the word line, a second bit line forming a bit line pair with the first bit line, a memory cell including an access transistor of an n-channel MISFET in which a gate electrode is connected to the word line and a first doped layer is connected to the first bit line, and a cell capacitor connected to a second doped layer of the access transistor, being capable of storing electric charge, and located at the intersection between the word line and the first bit line, and a sense amplifier for amplifying a potential difference between the first bit line and the second bit line during a read-out operation. In the semiconductor integrated circuit device, the threshold voltage of the access transistor is set to be lower than the threshold voltage of the n-channel MISFET provided in the logic circuit.

Thus, the threshold voltage of the logic circuit can be set to be low, so that operation speed can be improved. And at the same time, in the semiconductor memory device, an operation margin for the access transistor can be increased to ensure operation performance at a low voltage.

More specifically, it is preferable that the access transistor is a depletion type MISFET, and a positive power supply voltage is applied to a gate electrode of the access transistor through the word line when the memory cell is in an activated state.

If the cell capacitor is an n-channel MISFET, the semiconductor memory device can be formed in the same process step in which the logic circuit is formed. Therefore, fabrication costs can be reduced.

It is more preferable that the cell capacitor is a planar type MISFET.

If the cell capacitor is a depletion type MISFET, and during an operation period, the positive power supply voltage is applied to the gate electrode of the cell capacitor, it becomes possible to make the cell capacitor to stably store electric charge with a less number of power supplies that in the known semiconductor integrated circuit device.

If the access transistor includes a gate insulation film having a greater thickness than that of a gate insulation film of the n-channel MISFET in the logic circuit, gate leakage current can be suppressed. Therefore, data can be stored more stably.

If the thickness of the gate insulation film of the access transistor is equal to the thickness of a gate insulation film of the cell capacitor, the access transistor and the cell capacitor can be formed in the same process step. Therefore, the number of process steps can be further reduced.

If the access transistor and the cell capacitor share a substrate or a p-type well to which the positive power supply voltage is applied, the positive power supply voltage is applied to the first bit line in a high level state and the ground voltage is applied to the first bit line in a low level state, the number of necessary power supplies can be reduced to reduce a circuit area, compared to the known semiconductor integrated circuit device.

If the sense amplifier includes: an amplifier circuit which includes a pair of n-channel MISFETs and amplifies a potential difference between the pair of bit lines; and a n-channel drive MIS transistor which controls driving of the amplifier circuit and has a higher threshold voltage than that of the pair of n-channel MISFETs, an operation margin for the sense amplifier can be increased, compared to the known DRAM.

If each of the pair of n-channel MISFETs is a depletion type MISFET, an operation margin can be further increased.

If the dynamic semiconductor memory device further includes a precharging/equalizing circuit including: a bit line equalizing transistor of a depletion type n-channel MISFET for short-circuitting between the first bit line and the second bit line during a period in which the memory cell is in a non-activated state; and a bit line precharging transistor of depletion type n-channel MISFET for applying a constant voltage to the bit line pair during a period in which the memory cell is in a non-activated state, an operation margin for the precharging/equalizing circuit can be increased, compared to the known semiconductor integrated circuit device. Therefore, when operation margins for the memory cell and the sense amplifier are sufficiently large, operation performance can be improved.

If a voltage equal to or higher than a threshold voltage is applied to each gate electrode of the bit line equalizing transistor and the bit line precharging transistor during a period in which the memory cell is in a non-activated state, the potential of the bit line pair in a non-activated state can be reliably set to be a predetermined level.

If part of a process step for forming the dynamic semiconductor memory device is performed simultaneously to part of a logic process step for forming the logic circuit, the number of process steps can be reduced.

DESCRIPTION OF THE PREFERRED EMBODIMENTS

First Embodiment

Hereinafter, a semiconductor memory device according to a first embodiment of the present invention will be described with reference to the accompanying drawings.

Figure 1:
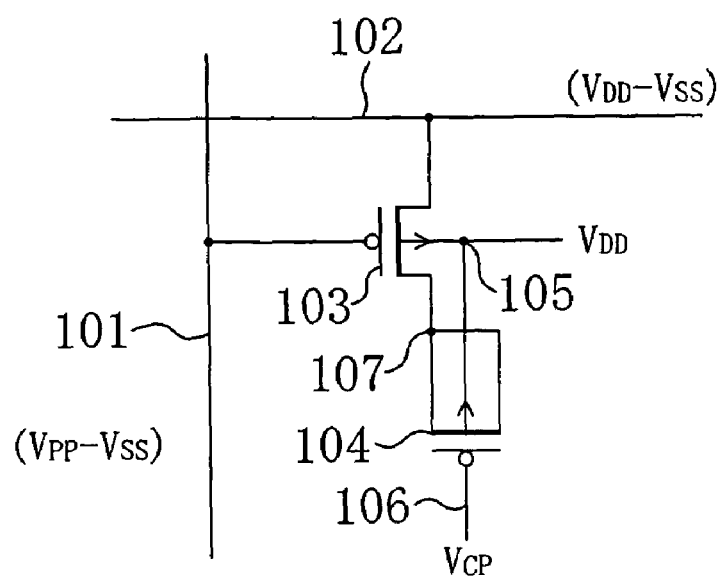
FIG. 1 is a circuit diagram illustrating a memory cell in a semiconductor memory device according to a first embodiment of the present invention.

FIG. 1 is a circuit diagram illustrating a memory cell in a dynamic semiconductor memory device (DRAM) according to the first embodiment of the present invention.

As shown in FIG. 1, the DRAM of this embodiment includes a plurality of word lines 101, a plurality of bit lines 102 and a plurality of memory cells. Each of the plurality of word lines 101 intersects with each of the plurality of bit lines 102 and the memory cells are arranged in a matrix so that each of the plurality of memory cells is provided at an intersection of one of the plurality of word lines 101 and associated one of the plurality of bit lines 102. Each of the memory cells includes a p-channel MOSFET, i.e., an access transistor (access Tr) 103 in which the word line 101 is connected to a gate electrode and which has a terminal (a first doped layer) connected to the bit line 102, and a p-channel MOSFET which functions as a capacitor, i.e., a cell capacitor 104. With this structure, data such as "0" or "1" can be stored in the memory cell storage node 107 provided between the access Tr 103 and the cell capacitor 104 in the DRAM of this embodiment.

Moreover, the DRAM of this embodiment is provided on a chip with a logic circuit and is formed by a logic process. Description about this will be given later.

The DRAM of this embodiment is characterized in that the DRAM consists of depletion type MOS transistors in which each of the access Tr 103 and the cell capacitor 104 has a threshold voltage of 0 V or more (0 V or positive). Thus, the potentials supplied to the access Tr 103 and the cell capacitor 104 can be onlly three potentials, i.e., the power supply potential $V_{DD}$, the increased potential $V_{PP}$ and the ground potential $V_{SS}$. In this case, for example, the power supply potential (power supply voltage) $V_{DD}$ is 1.5 V and the increased potential (increased voltage) $V_{PP}$ is 2.0 V.

Hereinafter, the operation of the DRAM of this embodiment will be described.

First, the cell capacitor 104 includes a cell plate electrode 106. The potential of the cell plate electrode 106 is a cell plate potential $V_{Cp}$ (=0 V) during an entire operation period. Thus, the cell capacitor 104 is kept in a state where a channel is formed at all the time and the cell capacitance of the cell capacitor 104 is not dependent on a write potential from the bit line 102 to the memory cell storage node 107, but is reliably stabilized. In this embodiment, since the threshold voltage of the cell capacitor 104 is 0 V or more, the cell plate potential $V_{Cp}$ can be set to be the ground potential $V_{SS}$ or a level close to the ground potential $V_{SS}$. When the cell plate potential $V_{Cp}$ is set to be $V_{SS}$, the number of power circuits can be reduced, compared to the known DRAM. Therefore, a circuit area can be reduced.

Moreover, the potential of a substrate shared by the access Tr 103 and the cell capacitor 104 or the potential of the well electrode 105 is the power supply potential $V_{DD}$ during an entire operation period. Thus, the substrate bias effect can be reduced and the threshold voltage of the access Tr 103 is increased, so that leakage current can be suppressed. Furthermore, in the DRAM memory cell of this embodiment, the access Tr 103 is a depletion type MOSFET and thus an operation margin is larger than that in the case where a regular MOSFET is used. For this reason, the lower limit a potential at which the access Tr 103 is turned ON can be set to be the ground potential $V_{SS}$. Thus, the number of power supplies can be further reduced, compared to the known DRAM.

Note that when the word line 101 is in an non-activated state (i.e., a memory cell is in a non-activated state), the potential of the word line 101 is set to be the increased potential $V_{PP}$ and the access Tr 103 is turned OFF. Moreover, the potential of the bit line 102 is set to be a bit line precharging voltage $V_{Bp}$ ($\approx V_{DD}/2$).

On the other hand, when the word line 101 is in an activated state (i.e., a memory cell is in an activated state), the potential of the word line 101 is the ground potential $V_{SS}$ and the access Tr 103 is turned ON.

Figure 2:
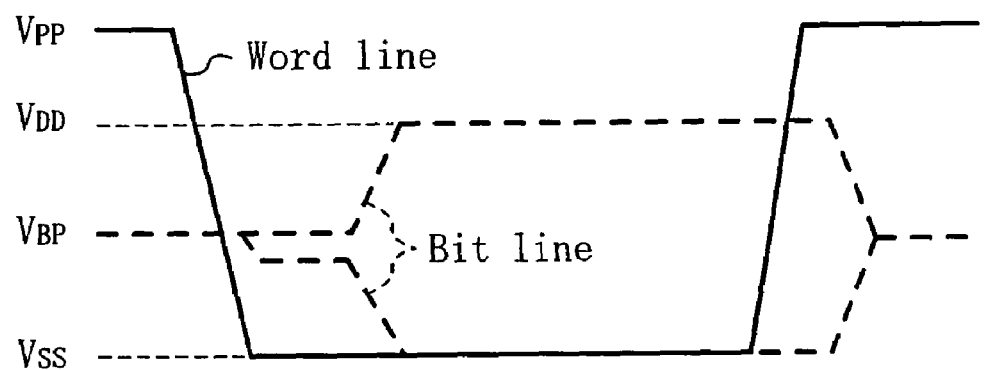
FIG. 2 is a conceptual view illustrating the operation of the semiconductor memory device of the first embodiment when "0" data is being read out.

FIG. 2 is a conceptual view illustrating the operation of the DRAM of this embodiment when "0" data is being read out.

As shown in FIG. 2, when data is being read out, the potential of the word line 101 is the ground potential $V_{SS}$, so that the access Tr 103 is turned ON. Then, stored information of "0" is read out through the bit line 102 connected to the access Tr 103 and the potential of the bit line 102 is slightly reduced. Subsequently, a sense amplifier amplifies a potential difference between two of the plurality of bit lines 102 forming a pair, thereby setting the potential of one of a pair of the bit lines 102 at the ground potential $V_{SS}$ and the potential of the other one of the pair of bit lines 102 at the power supply potential $V_{DD}$. Then, the amplified, stored information is output to the outside of the DRAM. In this manner, a read-out operation is performed.

On the other hand, when data is being written, although the operation of the word line 101 is performed in the same manner as in a read-out operation, the direction in which data is transmitted is reversed from that in a read-out operation. More specifically, the potential of the word line 101 is set at the ground potential $V_{SS}$ and the access Tr 103 is turned ON. In this case, information is transmitted from a write amplifier to the cell capacitor 104 via the sense amplifier through the bit line 102 and then is written onto the cell capacitor 104. If the potential of the bit line 102 is $V_{DD}$, information of "1" is written on the cell capacitor 104. If the potential of the bit line 102 is $V_{SS}$, information of "0" is written on the cell capacitor 104.

In the DRAM of this embodiment, the ground potential $V_{ss}$ is applied to the activated word line 101 during the data-read-out operation and data-write operation described above. In this case, when it is assumed that a voltage applied to the memory cell storage node 107 when "1" data is being written is VH and a voltage applied to the memory cell storage node 107 when "0" data is written is VL, $VH=V_{DD}$ and $VL=V_{SS}-V_{th}$ (when $V_{th}>0$ V, $VL=V_{SS}$) where $V_{th}$ is the threshold voltage of the access Tr 103.

More specifically, in the DRAM of this embodiment, when "0" data is written, $V_{th}$ of the access Tr 103 is 0 V or a positive level (depletion type Tr), so that "0" information of the bit line 102 can be written without charge loss.

Now, an overview of characteristics of the DRAM of this embodiment will be described.

First, it is only one power supply, i.e., a word line OFF power supply $V_{PP}$, besides external power supplies $V_{DD}$ and $V_{SS}$, that is required for bias of a memory cell of the DRAM of this embodiment. Thus, a circuit area can be largely reduced, compared to the known DRAM.

Moreover, the threshold voltage of the access Tr 103 or the threshold voltage of the cell capacitor 104 is 0 V and more. Thus, even if the potential of the word line in an activated state is at the ground potential, no charge loss is caused when "0" data is written from the bit line onto the memory cell storage node 107. Therefore, the sufficient quantity of charge for a data bit can be written.

Furthermore, when the word line 101 is in a non-activated state, the potential of the word line 101 is $V_{PP}$ ($>V_{DD}$). Thus, leakage current caused when the access Tr 103 is in an OFF state can be reduced. Therefore, time for which the memory cell stores information can be ensured.

In this manner, the DRAM of this embodiment can be operated with a reduced consumption power and a smaller circuit area, compared to the known DRAM.

Note that in the DRAM of this embodiment which has been described, depletion type MOSFETs with a threshold voltage of 0 V or more are used as the access Tr 103 and the cell capacitor 104. However, there may be cases where a MOSFET (of the enhancement type) with a negative threshold voltage can be used. For example, a transistor of which the threshold voltage has a sufficiently small absolute value, compared to a transistor of the logic circuit provided on the same chip, may be used. In other words, as long as a transistor is a p-channel MOSFET of which the threshold voltage is higher than those of p-channel MOSFETs in the logic circuit can be used. In this case, the smaller the absolute value of a threshold voltage is, the smaller loss of charge, which is caused when charge loss is caused when "0" data is written from the bit line onto the memory cell storage node 107, can be reduced. If the absolute value of a threshold voltage is sufficiently small, the number of power supplies can be reduced even with the enhancement type MOSFET. However, in view of reduction in power and circuit area, it is the most preferable to use the depletion type MOSFET.

Moreover, in the DRAM of this embodiment, the transistor constituting a memory cell is the p-channel MOSFET. However, an n-channel MOSFET may be used. In that case, the potential of the word line in a non-activated state is set at a negative increased potential, so that the potential of the word line in an activated state is a power supply potential, the substrate potential under the memory cell is the ground potential and the cell plate potential is a power supply potential. Description about this operation will be given later in another embodiment.

Device Structure of DRAM Memory Cell

Next, a device structure of the DRAM of this embodiment will be described.

Figure 3:
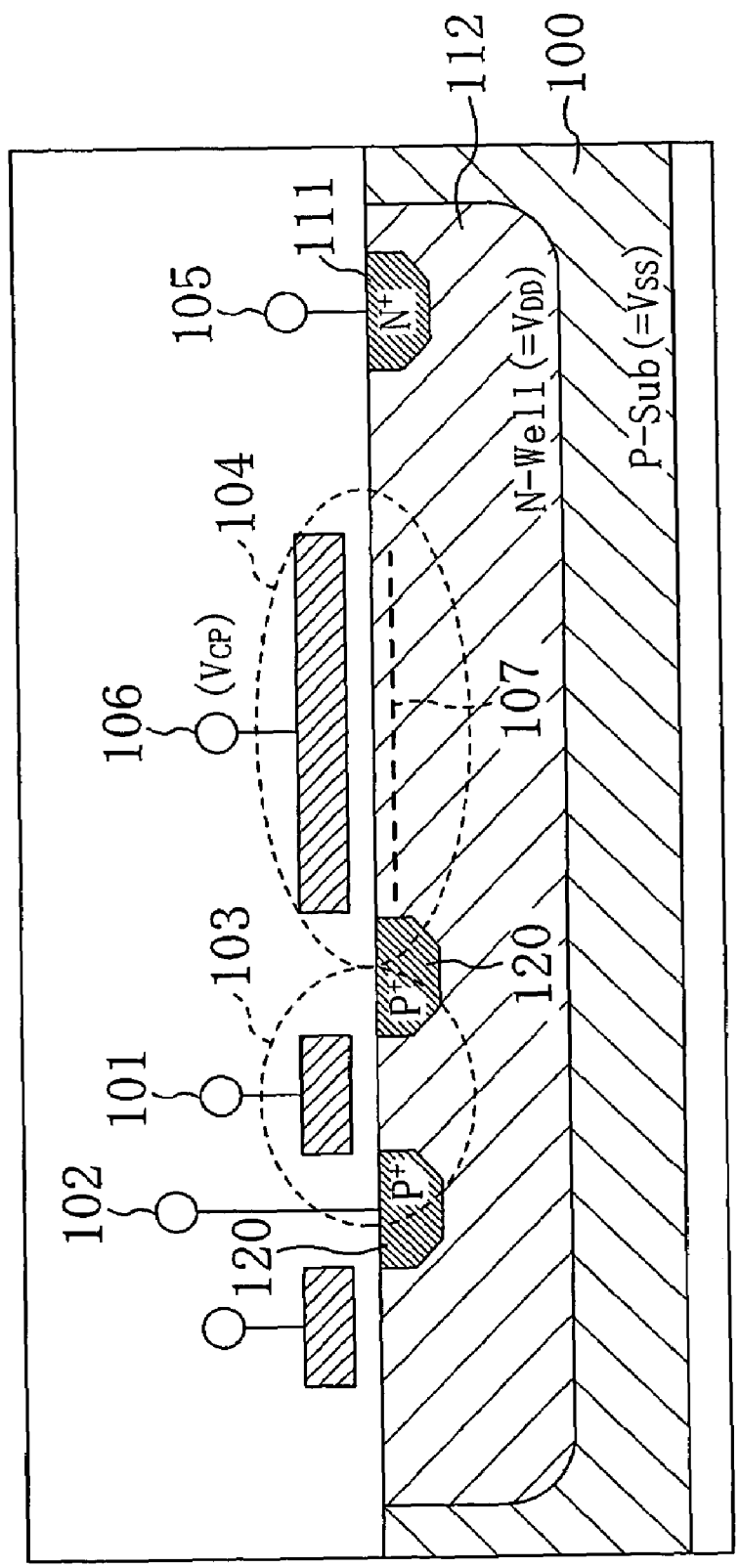
FIG. 3 is a cross-sectional view of a memory cell in the semiconductor memory device of the first embodiment.

FIG. 3 is a cross-sectional view illustrating a structure of the DRAM of this embodiment. As shown in FIG. 3, the DRAM memory cell of this embodiment includes a semiconductor substrate 100 formed of p-type silicon, an n-type well 112 formed in the semiconductor substrate 100 by implanting an n-type impurity, an access Tr 103 which is formed on the n-type well 112 and includes a pair of p-type impurity diffused layers 120, a gate insulation film and a gate electrode, and a cell capacitor 104 which shares one of the pair of p-type impurity diffused layers 120 with the access Tr 103 and includes a gate insulation film and a cell plate electrode 106. The gate electrode of the access Tr 103 is connected to the word line 101 and the other one of the pair of p-type impurity diffused layers 120 is connected to the bit line 102.

Figure 4:
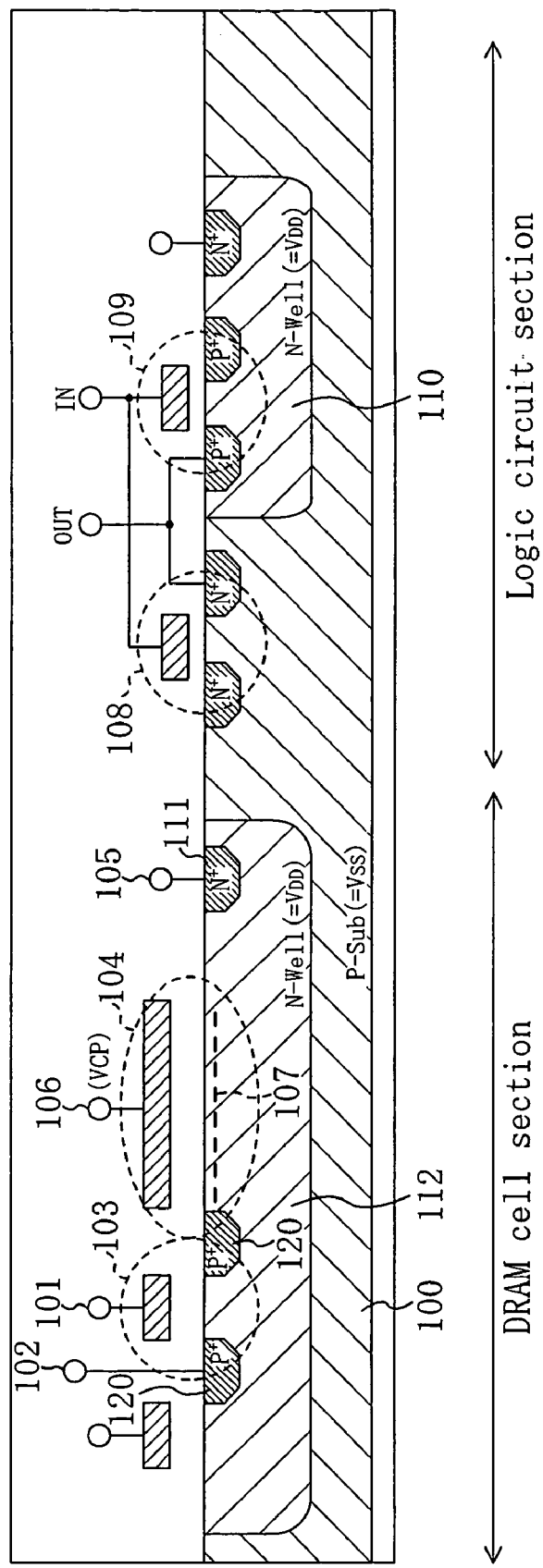
FIG. 4 is a cross-sectional view schematically illustrating a semiconductor integrated circuit including the semiconductor memory device of the first embodiment and a logic circuit.

Moreover, FIG. 4 is a cross-sectional view schematically illustrating a semiconductor integrated circuit including the DRAM memory cell of this embodiment and a logic circuit. As shown in FIG. 4, the DRAM of this embodiment is integrated with a logic circuit on the same chip. In this case, an example in which a logic circuit section is an inverter circuit including an NMOS logic transistor 108 and a PMOS transistor 109 provided on the semiconductor substrate 100 on which a DRAM cell section is provided is described.

Now, the DRAM of this embodiment is characterized in that the thickness of the gate insulation film of a transistor constituting the DRAM cell section is greater than that of the gate insulating film of a transistor constituting the logic circuit section. For example, in contrast to each of the thicknesses of the NMOS logic transistor 108 and the PMOS logic transistor 109 is about 2.5 nm, the gate insulation films of the access Tr 103 and the cell capacitor 104 have a thickness of about 3 nm. This structure can be formed by selectively oxidizing a substrate portion of the DRAM cell section for multiple times using a known logic process.

Note that the thickness of gate insulation film of the access Tr 103 may be different from that of the thickness of gate insulation film of the cell capacitor 104. However, if the access Tr 103 and the cell capacitor 104 have the same thickness, the gate insulating films of the access Tr 103 and the cell capacitor 104 can be formed in the same process step. Therefore, it is more preferable that the thicknesses of the gate insulation films of the access Tr 103 and the cell capacitor 104 are the same.

The DRAM cell section can be formed simultaneously to the logic circuit section using the same logic process. In this embodiment, to make it possible to form the DRAM cell portion using a logic process, as the cell capacitor 104, a stack cell or a trench cell is not used but a planar type MOS capacitor is used.

As has been described above, in the DRAM of this embodiment, for example, the logic circuit can be operated at a low voltage of about 1.5 V and an I/O section (input/output circuit section) inputting/outputting a signal from/to the outside of the DRAM and a protection device can be operated at about 2.0 V.

When it is intended to achieve improvement in processing speed and reduction in power consumption (reduction in voltage), the thickness of the gate insulating film is reduced in the transistor of the logic circuit section in many cases. In the DRAM of this embodiment, the thickness of gate insulation film of the transistor constituting the DRAM memory cell is increased, thereby suppressing gate leakage current. Thus, it is possible to stably perform a storing operation of a memory cell while improving the operation speed of the logic circuit section. Moreover, as described above, a depletion type MOSFET is used as a memory cell, a sufficient margin of a driving voltage can be ensured. Therefore, a necessary number of power supplies can be reduced to a smaller number than that in the known DRAM.

Note that an MISFET including a gate insulation film made of a material other than $SiO_2$ may be used for one or both of the access Tr 103 and the cell capacitor 104. More specifically, by using a dielectric material having a higher dielectric constant than that of $SiO_2$ as a material for the gate insulation film of the access Tr 103, a memory cell capacity can be increased. Accordingly, the DRAM can be stably operated. Such dielectric materials includes tantalum oxide, barium strontium titanate (BST), and the like.

Moreover, if a material for the gate insulation film of the cell capacitor 104 is a ferroelectric material, a FeRAM, instead of the DRAM, can be formed.

Figure 5:
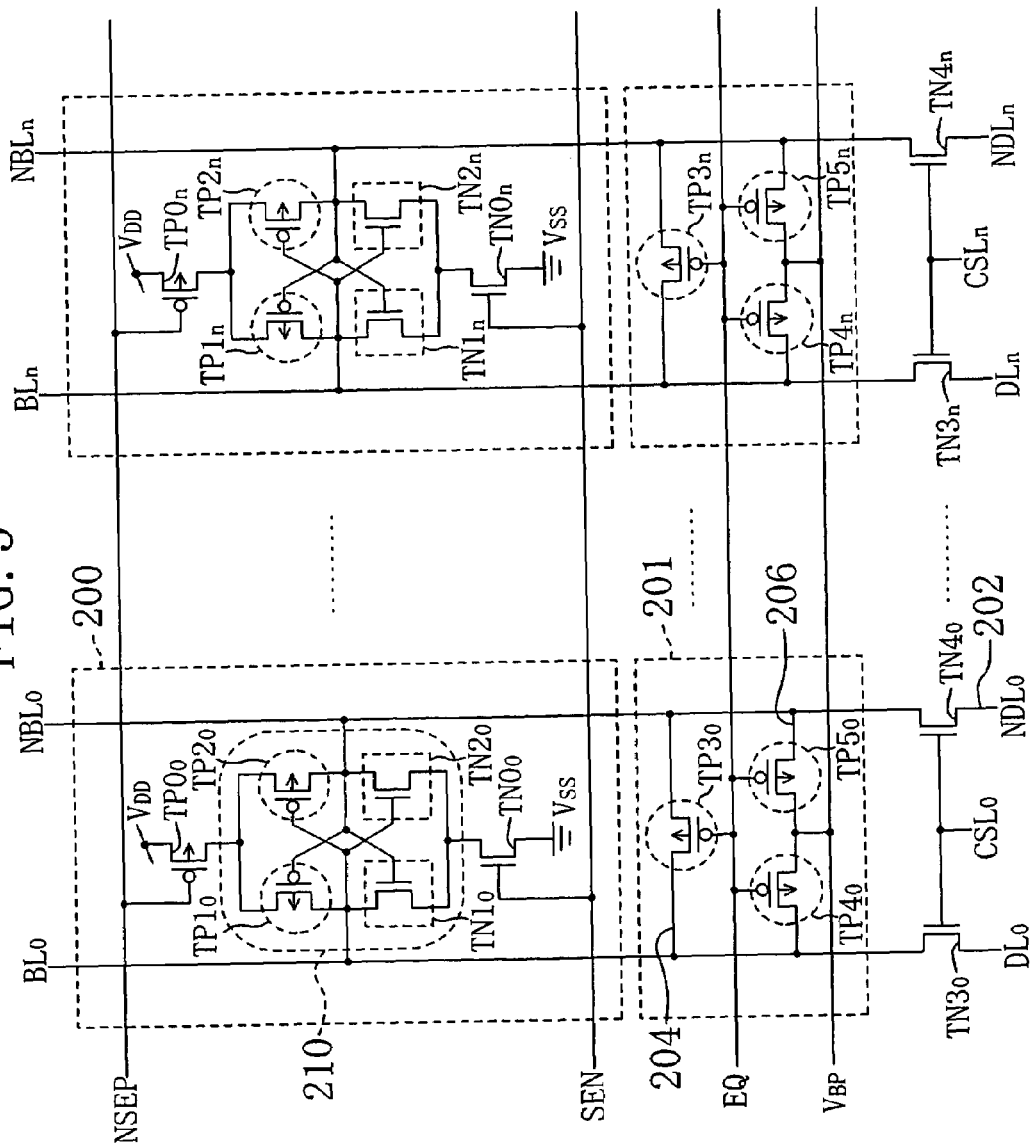
FIG. 5 is a circuit diagram illustrating a sense amplifier circuit, a bit line precharging/equalizing circuit, and a column select switch in the semiconductor memory device of the first embodiment.

Sense Amplifier Circuit, Bit Line Precharging/Equalizing Circuit, and Column Select Switch Circuit FIG. 5 is a circuit diagram illustrating a sense amplifier circuit, a bit line precharging/equalizing circuit, and a column select switch in the DRAM of this embodiment.

In the DRAM memory cell of this embodiment, read-out voltage information is amplified by a sense amplifier circuit 200 connected to a bit line. Moreover, a bit line precharging/equalizing circuit 201 precharges the voltage so that the potentials of a pair of bit lines is $V_{DD}/2$. Then, a column select switch 202 receives a column select control signal CSL to activate a selected pair of bit lines.

In the DRAM of this embodiment, as in the memory cell section, a depletion type MOSFET or a p-channel MOSFET having a higher threshold voltage than those of p-channel MOSFETs in the logic circuit section can be used for each of the sense amplifier circuit 200 and the bit line precharging/equalizing circuit 201, thereby increasing an operation margin. In the known DRAM, limitation is imposed on reduction in power consumption and stable operation mainly because a memory cell has a small operation margin. In this embodiment, however, the operation margin of a memory cell is increased. Therefore, by increasing the operation margin of a peripheral circuit such as the sense amplifier circuit 200, operation performance can be further improved.

Hereinafter, description on these circuits will be given.

As shown in FIG. 5, the DRAM includes a pair of bit lines ($BL_0$, $NBL_0$), the sense amplifier circuit 200 provided between the bit line $BL_0$ and the bit line $NBL_0$, the bit line precharging/equalizing circuit 201 and the column select switch 202. A plural number of the bit line pairs are provided, and the sense amplifier circuit 200, the bit line precharging/equalizing circuit 201 and the column select switch 202 are provided for every bit line pair. In FIG. 5, n pairs (n is 2 or a natural number larger than 2) of bit lines and each of the bit line pairs has the same structure. Therefore, circuits for the bit line $BL_0$ and $NBL_0$ will be described as an example.

First, as shown in FIG. 5, the sense amplifier circuit 200 includes an amplifier circuit 210 including a pair of p-type MOSFETs and a pair of n-type MOSFETs, a p-type sense amplifier driving transistor $TP0_0$ which controls the operation of the amplifier circuit and has a higher threshold voltage than those of the pair of p-type MOSFETs, and an n-type sense amplifier driving transistor $TN0_0$ which controls the operation of the amplifier circuit. The amplifier circuit 200 amplifies a potential difference between a bit line pair. Each of the p-type sense amplifier driving transistor $TP0_0$ and the n-type sense amplifier driving transistor $TN0_0$ is a MOSFET.

The amplifier circuit 210 includes first and second p-type sense amplifier transistors $TP1_0$ and $TP2_0$, a first n-type sense amplifier transistor $TN1_0$, and a second n-type sense amplifier transistor $TN2_0$. The first p-type sense amplifier transistor $TP1_0$ is a p-channel MOSFET in which a source is connected to the gate of the second p-type sense amplifier transistor $TP2_0$ and a gate is connected to the source of the second p-type sense amplifier transistors $TP2_0$. The second p-type sense amplifier transistor $TP2_0$ is a p-type MOSFET in which a source is connected to the gate of the second p-type sense amplifier transistor $TP1_0$ and a gate is connected to the source of the second p-type sense amplifier transistor $TP1_0$. The first n-type sense amplifier transistor $TN1_0$ is an n-channel MOSFET in which a drain and a gate are connected to the drain and gate of the first p-type sense amplifier transistor $TP1_0$, respectively. The second n-type sense amplifier transistor $TN2_0$ is an n-channel MOSFET in which a drain and a gate are connected to the drain and gate of the second p-type sense amplifier transistor $TP2_0$, respectively, and a source is connected to the source of the first n-type sense amplifier transistor $TN1_0$.

In the p-type sense amplifier driving transistor $TP0_0$, the power supply potential (power supply voltage) $V_{DD}$ is applied to the source, and the drain is connected to the first p-type sense amplifier transistor $TP1_0$ and the source of the second p-type sense amplifier transistor $TP2_0$. Moreover, in the n-type sense amplifier driving transistor $TN1_0$, the source is grounded and the drain is connected to the first n-type sense amplifier transistor $TN1_0$, and the source of the second n-type sense amplifier transistor $TN2_0$.

Then, the respective drains of the first p-type sense amplifier transistor $TP1_0$ and the first n-type sense amplifier transistor $TN1_0$ and the respective gates of the second p-type sense amplifier transistor $TP2_0$ and the second n-type sense amplifier transistor $TN2_0$ are connected to the bit line $BL_0$ to share the bit line $BL_0$. The respective drains of the second p-type sense amplifier transistor $TP2_0$ and the sense amplifier transistor $TP1_0$, and the respective gates of the first p-type sense amplifier transistor $TP1_0$ and the first n-type sense amplifier transistor $TN1_0$ are connected to the bit line $NBL_0$ to share the bit line $NBL_0$. Moreover, the p-type sense amplifier driving transistor $TP0_0$ is controlled by a first sense amplifier signal NSEP applied to the gate of the p-type sense amplifier driving transistor $TP0_0$, and the n-type sense amplifier driving transistor $TN0_0$ is controlled by a second sense amplifier signal SEN applied to the gate of the n-type sense amplifier driving transistor $TN0_0$.

Next, the bit line prechrging/equalizing circuit 201 includes first and second interconnects 204 and 206, a bit line equalizing transistor $TP3_0$, and first and second bit line precharging transistors $TP4_0$ and $TP5_0$. Each of the first and second interconnects 204 and 206 connects the bit line $BL_0$ and the bit line $NBL_0$. The bit line equalizing transistor $TP3_0$ is a p-channel MOSFET which is provided on the first interconnect 204 and in which a bit line precharging/equalizing control signal EQ is applied to a gate. The first and second bit line precharging transistors $TP4_0$ and $TP5_0$ are p-channel MOSFETs which are provided in series on the second interconnect 206 and in which a bit line precharging/equalizing control signal EQ is applied to a gate. Moreover, a bit line precharging potential $V_{BP}$ ($\approx V_{DD}/2$) is connected between the first bit line precharging transistor $TP4_0$ and the second bit line precharging transistor $TP5_0$.

Next, the column select switch 202 includes a first column select transistor $TN3_0$ which is an n-channel MOSFET having a terminal connected to the bit line $BL_0$ and another terminal connected to a data bus $DL_0$ and a second column select transistor $TN4_0$ which is an n-channel MOSFET having a terminal connected to the bit line $NBL_0$ and another terminal connected to a data bus $NDL_0$. The first column select transistor $TN3_0$ and the second column select transistor $TN4_0$ are controlled by a column select control signal $CSL_0$ generated by a column decoder (not shown) to be in a conductive state or a non-conductive state.

The sense amplifier circuit 200 and the bit line precharging/equaling circuit 201 are characterized in that the respective threshold voltages of the first p-type sense amplifier transistor $TP1_0$, the second sense amplifier transistor $TP2_0$, the bit line equalizing transistor $TP3_0$, the first bit line precharging transistor $TP4_0$ and the second bit line precharging transistor $TP5_0$ which are circled in FIG. 5 are set to be higher than those of the p-channel MOSFETs in the logic circuit section. Thus, in the sense amplifier circuit 200 and the bit line precharging/equalizing circuit 201, an operation margin at a low voltage is increased. The bit line precharging/equalizing circuit 201, specifically, may include a depletion type MOSFET.

Moreover, the gate insulation film of each of those transistors has the same thickness as the thickness of the MOS transistors in the logic circuit section.

In contrast, the respective threshold voltages of the first n-type sense amplifier transistor $TN1_0$ and the second n-type sense amplifier transistor $TN2_0$ which are squared in FIG. 5 are set to be lower than those of n-channel MOSFETs provided in the logic circuit section. Thus, when the same gate voltage is applied, a source-drain current flows more easily, compared to the known DRAM. Therefore, the operation margin of the sense amplifier at a low voltage can be further increased. Note that for each of these n-channel MOSFETs, a depletion type MOSFET may be used.

Moreover, the threshold voltage of the p-type sense amplifier driving transistor $TP0_0$ is set to be lower than those of the first and second p-type sense amplifier transistors $TP1_0$ and $TP2_0$. Then, the threshold voltage of the n-type sense amplifier driving transistor $TN0_0$ is set to be higher than those of the first n-type sense amplifier transistor $TN1_0$ and the second p-type senses amplifier transistor $TN2_0$. The threshold voltages are set in the above-described manner to suppress flow of leakage current when the sense amplifier circuit 200 is in a non-activated state. Note that the threshold voltage of the p-type sense amplifier driving transistor $TP0_0$ may be set to be equal to that of the p-channel MOSFET constituting the logic circuit.

Next, the operation of each of the sense amplifier circuit, the bit precharge/equalizing circuit, and the column select switch circuit will be described.

Figure 6:
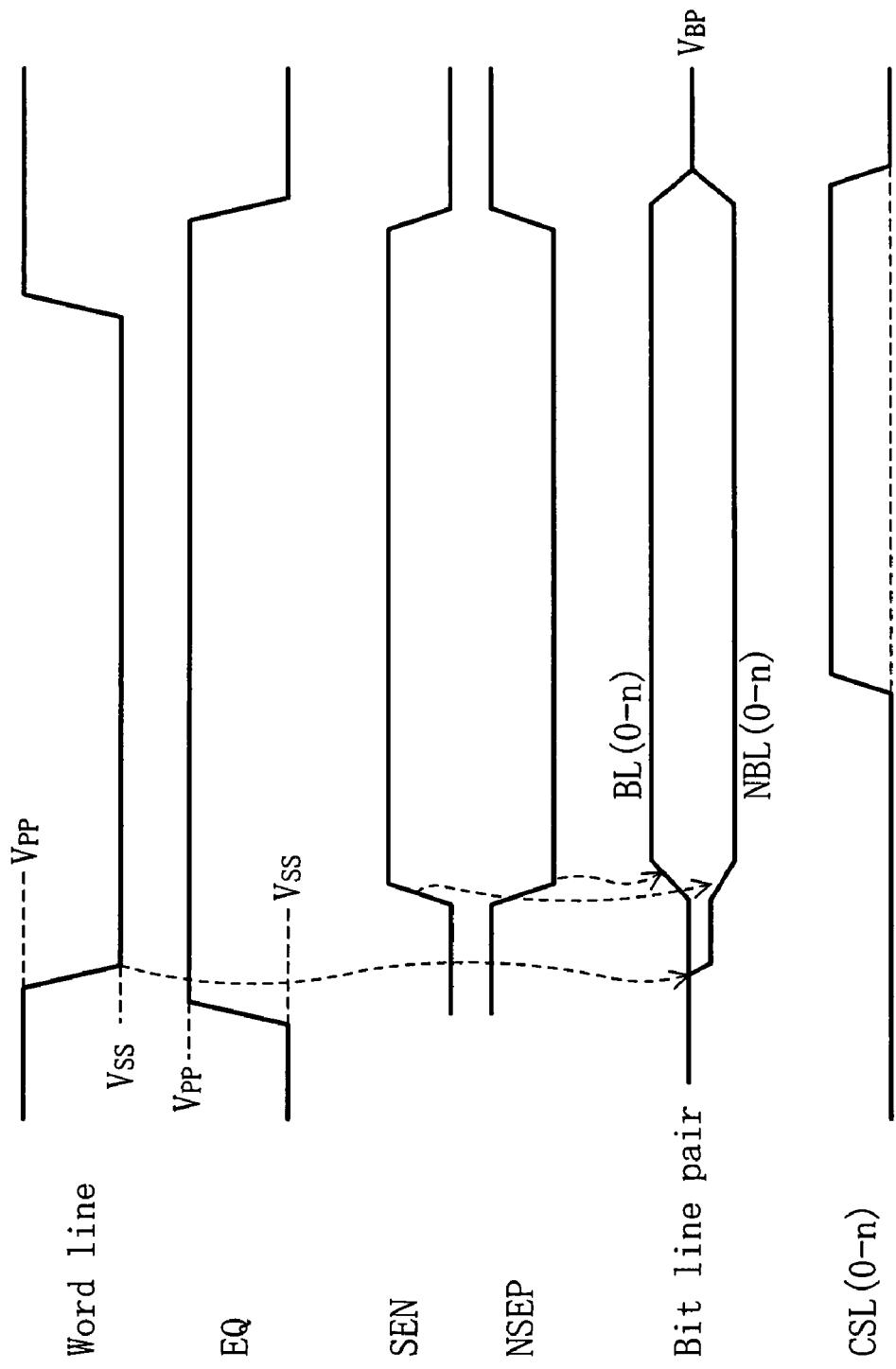
FIG. 6 is a timing chart showing potential changes of each signal, a bit line pair and a word line shown in FIG. 5.

FIG. 6 is a timing chart showing potential changes of each signal, a bit line pair and a word line. Specifically, FIG. 6 is a timing chart showing a timing for reading out "0" data.

First, when the semiconductor memory device of this embodiment is in a non-activated state, the potential of the bit line precharging/equalizing signal EQ becomes a "L (low)" level. Then, the p-channel MOSFET constituting the bit line precharging/equalizing circuit becomes conductive, so that the respective potentials of the bit line pairs BL and NBL are precharged. Note that the column select switch 202 is OFF.

Next, when the semiconductor memory device is in an activated state, the bit line precharging/equalizing signal EQ becomes the "H" level and is no longer in a precharged state.

At this time, the potential of the bit line precharging/equalizing signal EQ is set at the increased potential $V_{PP}$ so that the bit line equalizing transistor $TP3_0$ and the first and second bit line precharging transistors $TP4_0$ and $TP5_0$ are reliably OFF.

Thereafter, the potential of the word line selected by a row address changes from $V_{PP}$ to $V_{SS}$. Then, when the word line is activated, data stored in the memory cell is read out as a very small potential difference by the bit line pairs BL and NBL. Subsequently, when the first sense amplifier signal NSEP is changed to a "L (low)" level and the second sense amplifier driving signal SEN is changed to a "H (high)" level, the sense amplifier circuit 200 is activated, so that the very small potential difference read out from the memory cell is amplified. Then, the column select switch selected by a column address is turned ON, so that data is exchanged through the data bus pairs DL and NDL.

Thereafter, to make the semiconductor memory device in a non-operation state, the potential of the word line is first changed from $V_{SS}$ to $V_{PP}$ to be non-activated. In this state, re-write of data on the memory cell provided on the bit line is completed, and then the potential of the bit line precharging/equalizing signal EQ becomes the "L" level again. In this manner, a bit line precharging/equalizing operation is performed to make the device in a stand-by state. As has been described, if the configuration of the sense amplifier circuit of this embodiment is used with the memory cell of this embodiment, an operation margin can be further increased. Therefore, operation stability can be improved and operation speed can be increased.

Note that even if the MOSFET constituting the sense amplifier circuit, the bit line precharging/equalizing circuit, the column select switch or the like is substituted by an MISFET, the same effects can be obtained.

Whole Structure of Semiconductor Device

Figure 7:
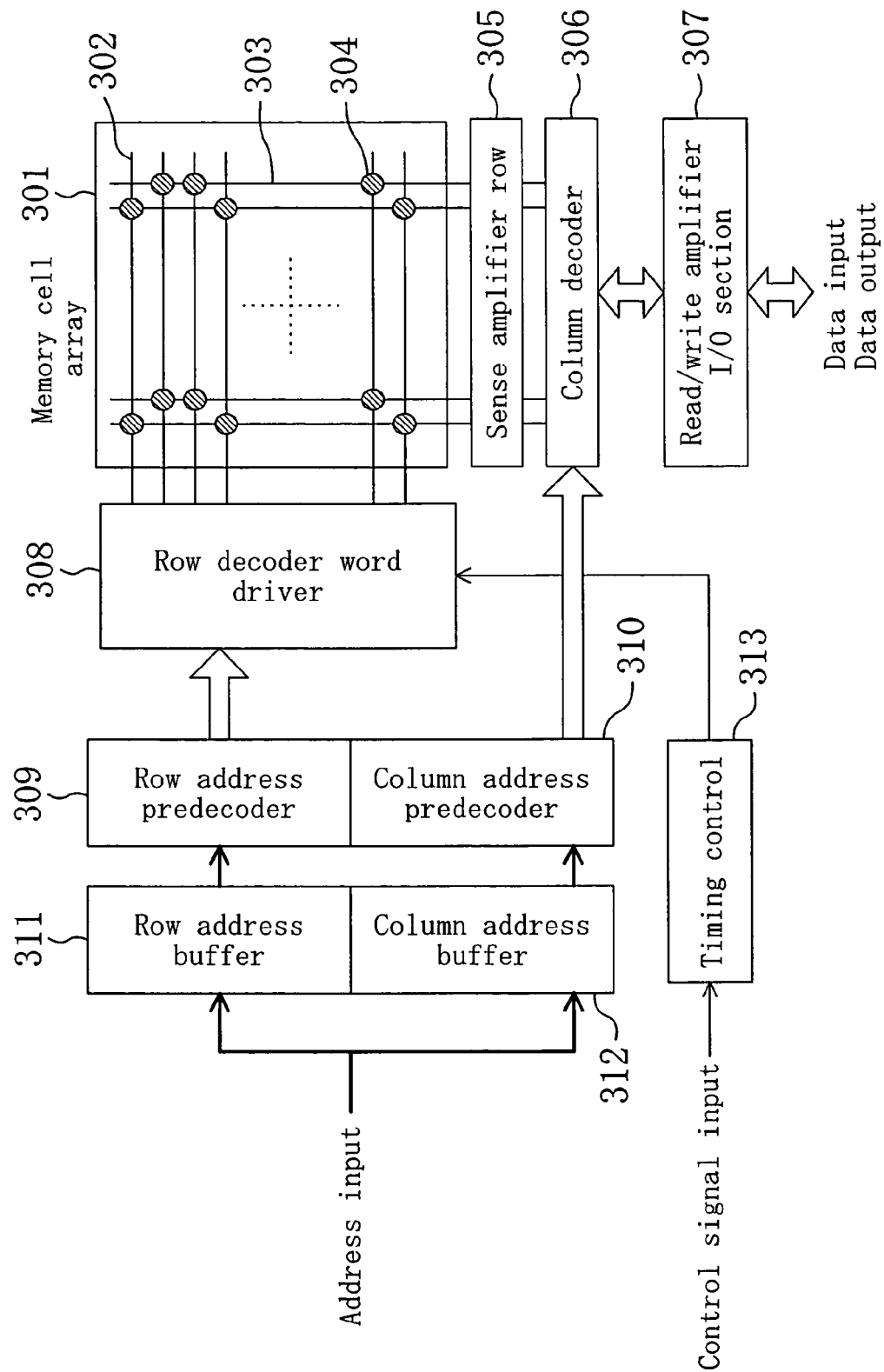
FIG. 7 is a block diagram illustrating the whole semiconductor memory device of the first embodiment.

FIG. 7 is a block diagram illustrating the whole semiconductor memory device of the first embodiment.

As shown in FIG. 7, in the semiconductor device, an external address input is decoded by a row decoder/word driver 308 via a row address buffer 311 and a row address predecoder 309. Then, the word line 302 corresponding to address information is activated by the row decode/word driver 308 and information stored in the memory cell is transferred to the bit line 303. In this case, an activated signal by the word driver is controlled by the timing control circuit 313. The information transferred to the bit line 303 is amplified by a sense amplifier in a sense amplifier row 305.

Moreover, the address input is transferred to a column decoder 306 via a column address buffer 312 and a column address predecoder 310. Then, a sense amplifier corresponding to the address information is selected by the column decoder 306, so that data can be exchanged with the outside of the device via a read/write amplifier 307.

Figure 8:
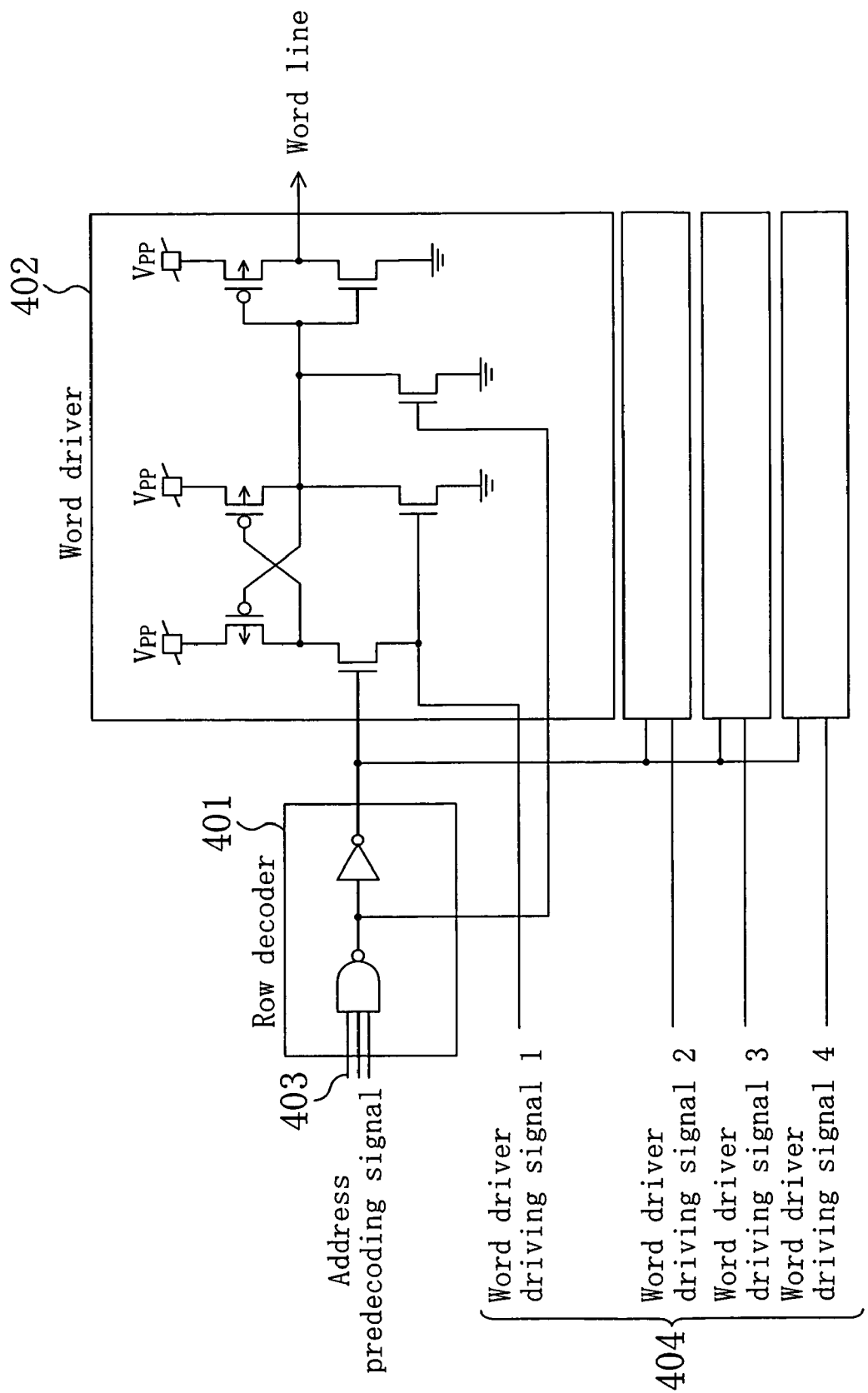
FIG. 8 is a circuit diagram illustrating an exemplary configuration of a row decoder/word driver in the semiconductor memory device of the first embodiment shown in FIG. 7.

FIG. 8 is a circuit diagram illustrating an exemplary configuration of a row decoder/word driver in the semiconductor memory device of this embodiment shown in FIG. 7.

As shown in FIG. 8, an external input address is decoded by an address predecoding signal 403. Subsequently, the external input address which has been transferred to the word driver 402 undergoes a voltage change to select a corresponding word line and to initiate the selected word line. The potential of the word line at this time is set at the internal increased potential $V_{PP}$ in a non-activated state and the ground potential $V_{SS}$ in an activated state.

Next, an exemplary circuit which generates such an internal increased potential $V_{PP}$ will be described.

Figure 9:
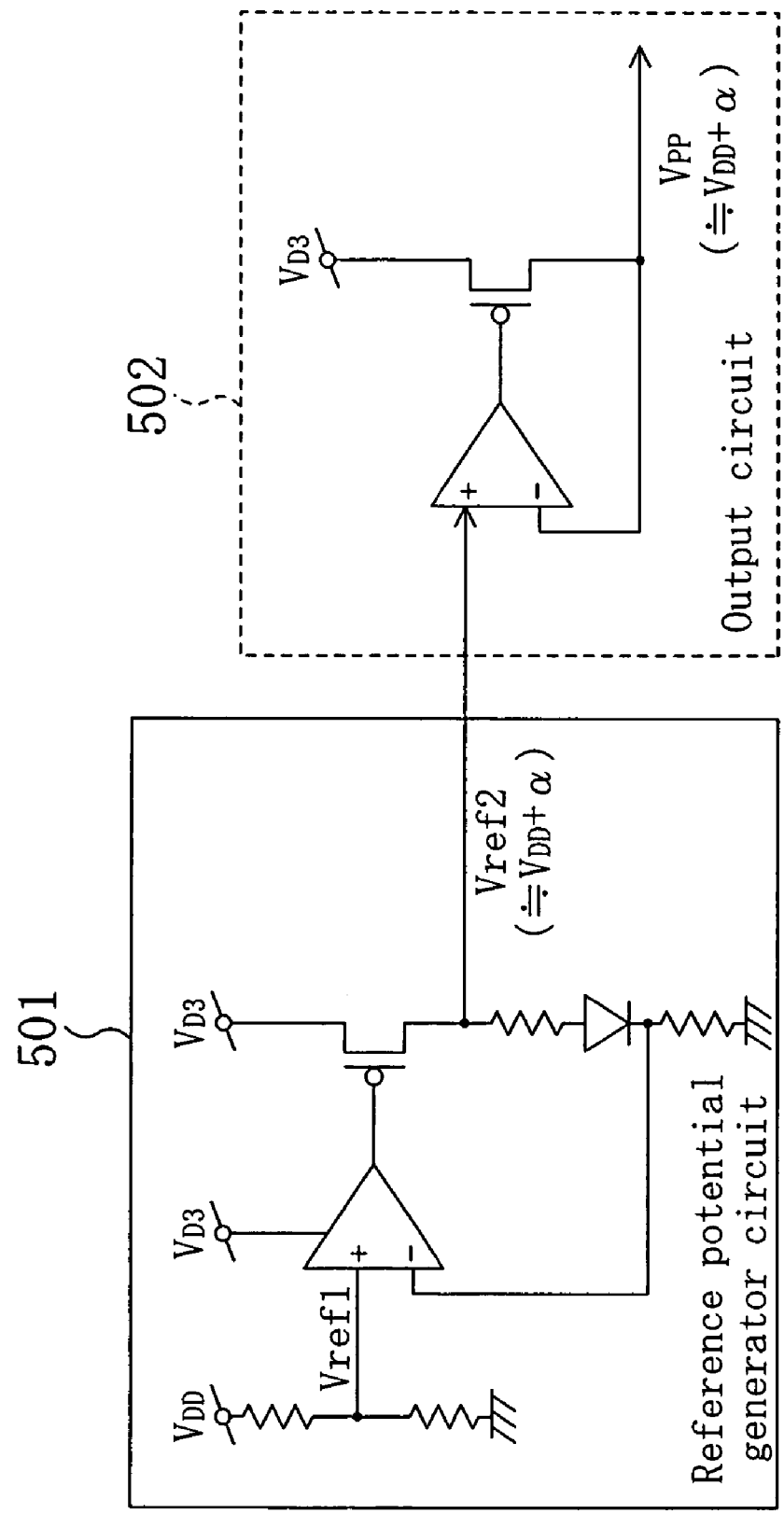
FIG. 9 is a circuit diagram illustrating a first exemplary configuration of an increased potential generator circuit for generating an internal increased potential $V_{PP}$ of FIG. 8.
Figure 10:
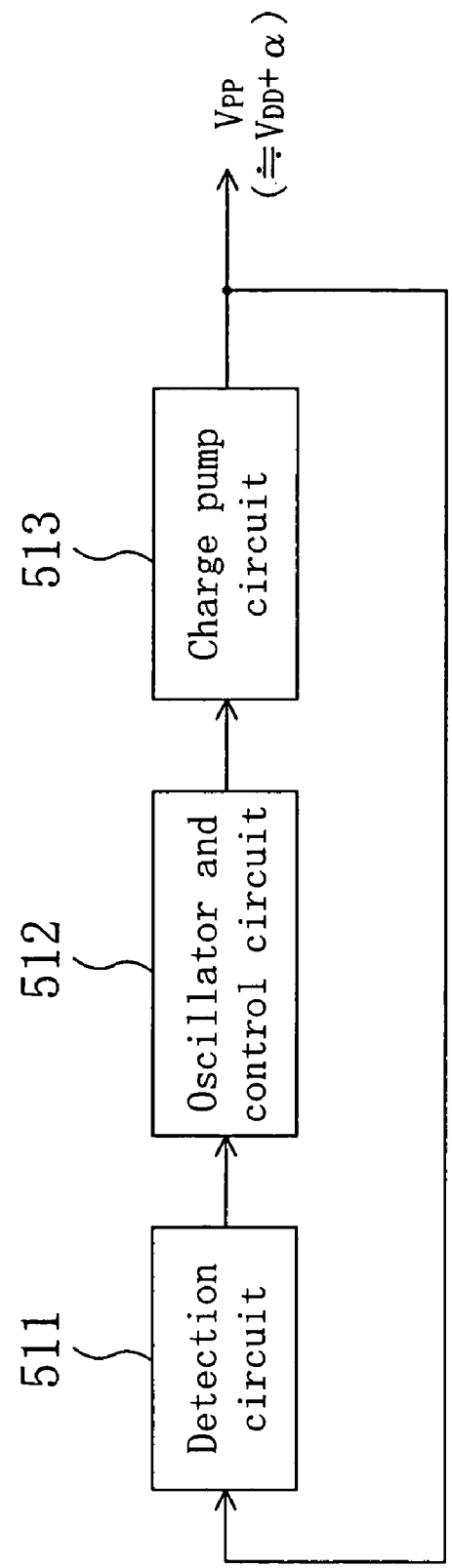
FIG. 10 is a block diagram illustrating a second exemplary configuration of an increased potential generator circuit for generating an internal increased potential $V_{PP}$ of FIG. 8.

FIGS. 9 and 10 are circuit and block diagrams illustrating exemplary configurations of an increased potential generator circuit for generating the internal increased potential $V_{PP}$ of FIG. 8.

First, an increased potential generator circuit of FIG. 9 is obtained by using as an input a first reference potential Vref 1 determined according to an external power supply for supplying the power supply $V_{DD}$ and the external power potential $VD_3$ ($>V_{DD}$) is reduced using the first reference potential Vref 1. More specifically, the increased potential generator circuit includes a reference potential generator circuit 501 for receiving a first reference potential Verf 1 and outputting a second reference potential Vref 2 and an output circuit 502 for receiving the second reference potential Vref 2 to generate an increased potential $V_{PP}$. In this case, for example, VDD is a potential of a power supply for the logic transistor, i.e., 1.5 V and $V_{D3}$ is a potential of a power supply for a transistor used for an I/O or analog circuit, i.e., 3.3 V.

When two types of external power supplies exist, the above-described structure can be applied. Therefore, this structure can be widely used in recent system LSIs and other semiconductor devices.

In contrast, when a single external power supply is provided, the increased potential generator circuit of FIG. 10 can be used to generate an increased potential $V_{PP}$.

The increased potential generator circuit of FIG. 10 has a structure in which an increased voltage power with respect to $V_{DD}$ is generated by a charge pump circuit and includes a detection circuit 511 for detecting an output voltage, an oscillator, a (pumping) control circuit 512 and a charge pump circuit 513. This structure is widely used for recent semiconductor devices, and therefore, description thereof will be omitted.

By using the above-described circuit, the semiconductor device of this embodiment can be achieved.

Second Embodiment

As a DRAM according to a second embodiment of the present invention, an exemplary structure in which each of an access Tr and a cell capacitor constituting a memory cell is formed of an n-channel MOSFET will be described.

Figure 11:
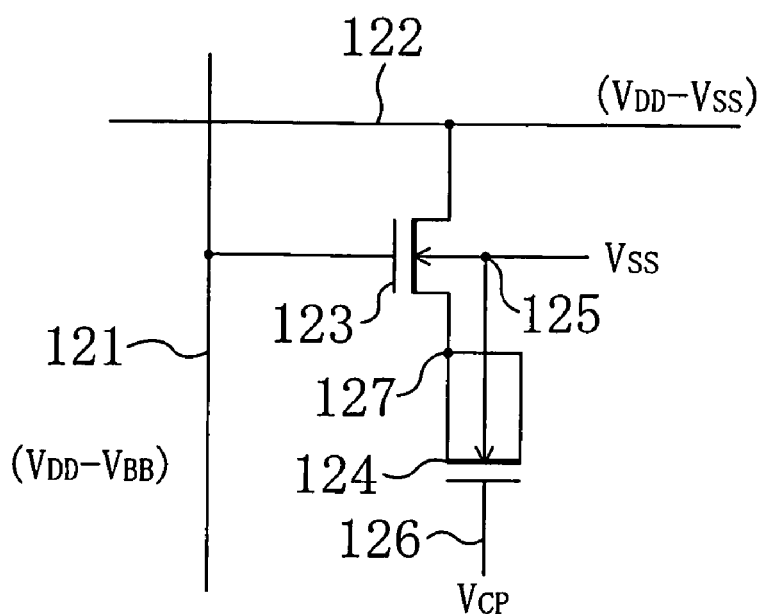
FIG. 11 is a circuit diagram illustrating a memory cell in the semiconductor memory device according to a second embodiment of the present invention.

FIG. 11 is a circuit diagram illustrating a memory cell in a DRAM according to the second embodiment of the present invention.

As shown in FIG. 11, the DRAM of this embodiment includes a plurality of word lines 121, a plurality of bit lines 122 and a plurality of memory cells. Each of the plurality of word lines 121 intersects with associated ones of the plurality of bit lines 122 and the memory cells are arranged so that each of the plurality of memory cells is provided at an intersection of one of the plurality of word lines 121 and associated one of the plurality of bit lines 122. Each of the memory cells includes an n-channel MOSFET, i.e., an access Tr 123 in which the word line 121 is connected to a gate electrode and which has a tremianl (a first doped layer) connected the bit line 122 and an n-channel MOSFET, i.e., a cell capacitor 124 which is connected to another terminal (a second doped layer) of the access Tr 123 and functions as a capacitor. As in the first embodiment, the DRAM of this embodiment is provided on a chip with a logic circuit and is formed by a logic process.

The DRAM of this embodiment is characterized in that each of the access Tr 123 and the cell capacitor 124 is a depletion type MOS transistor which has a threshold voltage of 0 V or less (0V or negative). Thus, the potentials supplied to the access Tr 123 and the cell capacitor 124 can be only three potentials, i.e., the power supply potential $V_{DD}$, the negative increased potential $V_{BB}$ and the ground potential. In this case, for example, the power supply potential (power supply voltage) $V_{DD}$ is 1.5 V and the negative increased potential (negatively increased voltage) $V_{BB}$ is −5 V.

Moreover, the gate insulation film of the access Tr 123 has a greater thickness than those of insulation films of n-channel MOSFETs provided in a logic circuit provided together with the DRAM of this embodiment. Thus, gate leakage current in the access Tr 123 can be reduced while achieving improvement of logic circuit performance, such as increase in operation speed.

In the DRAM of this embodiment, each of the access Tr 123 and the cell capacitor is formed of an n-channel MOSFET. Therefore, part of the DRAM of this embodiment is controlled in a different manner from that in the case of the DRAM of the first embodiment. Hereinafter, the operation of the DRAM of this embodiment will be described.

First, the cell capacitor 124 includes a cell plate electrode 126. The potential of the cell plate electrode 126 is a cell plate potential $V_{Cp}$ ($=V_{DD}$) during an entire operation period. Thus, the cell capacitor 124 is kept in a state where a channel is formed at all the time and the cell capacitance of the cell capacitor 124 is not dependent on a write potential from the bit line 122 to the memory cell storage node 127, but is reliably stabilized. In this embodiment, since the threshold voltage of the cell capacitor 124 is 0 V or less, the cell plate potential $V_{Cp}$ can be set to be the power supply voltage $V_{DD}$ or a level close to the power supply voltage $V_{DD}$. When the cell plate potential $V_{Cp}$ is set to be $V_{DD}$, the number of power circuits can be reduced, compared to the known DRAM. Therefore, a circuit area can be reduced.

Moreover, the potential of a substrate shared by the access Tr 123 and the cell capacitor 124 or the potential of the well electrode 125 is the ground potential $V_{SS}$ during an entire operation period. Thus, the substrate bias effect in the access Tr 123 and the cell capacitor 124 can be reduced. Furthermore, in the DRAM memory cell of this embodiment, the access Tr 123 is a depletion type MOSFET and thus an operation margin is larger than that in the case where a regular MOSFET is used. For this reason, a potential at which the access Tr 123 is turned On can be set to be the power supply potential $V_{DD}$. Thus, the number of power supplies can be further reduced, compared to the known DRAM and a circuit area can be reduced.

Figure 12:
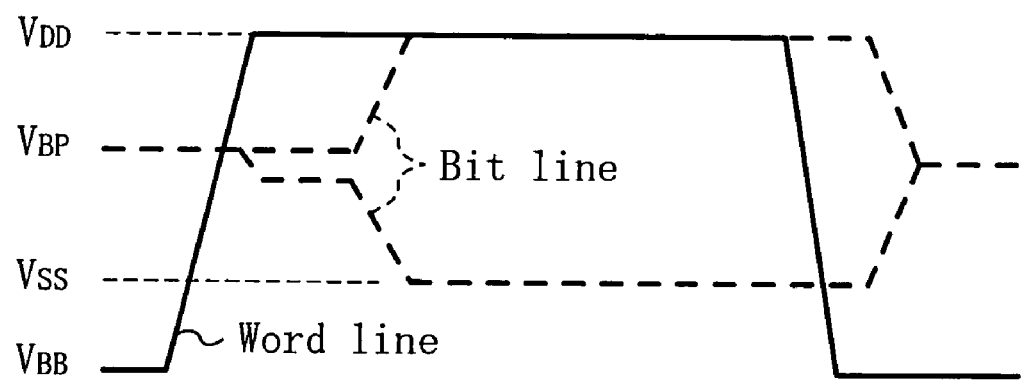
FIG. 12 is a conceptual view illustrating the operation of the semiconductor memory device of the second embodiment when "0" data is being read out.

FIG. 12 is a conceptual view illustrating the operation of the DRAM of this embodiment when the DRAM reads "0" data.

As shown in FIG. 12, while data is being read out, the potential of the word line 121 is changed from the negative increased potential $V_{BB}$ to the power supply potential $V_{DD}$, so that the access Tr 123 is turned ON. Then, stored information of "0" is read through the bit line 122 connected to the access Tr 123 and the potential of each of the plurality of bit lines 122 is slightly reduced. Subsequently, a sense amplifier amplifies a potential difference between two of the plurality of bit lines 122 forming a pair, thereby setting the potential of one of the pair of the bit lines 122 at the ground potential $V_{SS}$ and the potential of the other one of the pair of the bit lines 122 at the power supply potential $V_{DD}$. Then, the amplified, stored information is output to the outside of the DRAM. In this manner, a read-out operation is performed. Note that the operation of the word line 121 in a write operation is performed in the same manner as in a read-out operation. However, the direction in which data is transmitted is reversed from that in a read-out operation.

In the DRAM of this embodiment, the power supply potential $V_{DD}$ is applied to the activated word line 121 during a data-read-out operation or a data-write operation. In this case, when it is assumed that a voltage applied to the memory cell storage node 127 when "1" data is being written is VH and a voltage applied to the memory cell storage 127 when "0" data is written is VL, VH=$V_{DD}$-$V_{th}$ (when $V_{th}$<0 V, VH=$V_{DD}$) and VL=$V_{SS}$. In this case, $V_{th}$ is the threshold voltage of the access Tr 123.

More specifically, in the DRAM of this embodiment, when "1" data is written, $V_{th}$ of the access Tr 123 is 0 V or a negative level (depletion type Tr), so that "1" information of the bit line 102 can be written without charge loss.

As has been described, even when an n-channel MOSFET is used as each of an access Tr and a cell capacitor, an operation margin can be increased, charge loss during a data write operation can be reduced, a circuit operation can be reduced by reducing the number of power supplies, and other effects can be achieved.

Note that in the DRAM memory cell of this embodiment, each of the access Tr 123 and the cell capacitor 124 are not necessarily a depletion type MOSFET. The respective threshold voltages of the access Tr 123 and the cell capacitor 124 are lower than those of n-channel MOSFETs in the logic circuit located on the same chip, an operation margin can be increased. However, the number of power supplies is the same as in the known DRAM. Therefore, when an area has to be reduced, it is more preferable that a depletion type MOSFET is used.

Moreover, in this embodiment, an MISFET may be also used instead of an MOSFET constituting a memory cell.

Next, a device structure of the DRAM of this embodiment will be described.

Figure 13:
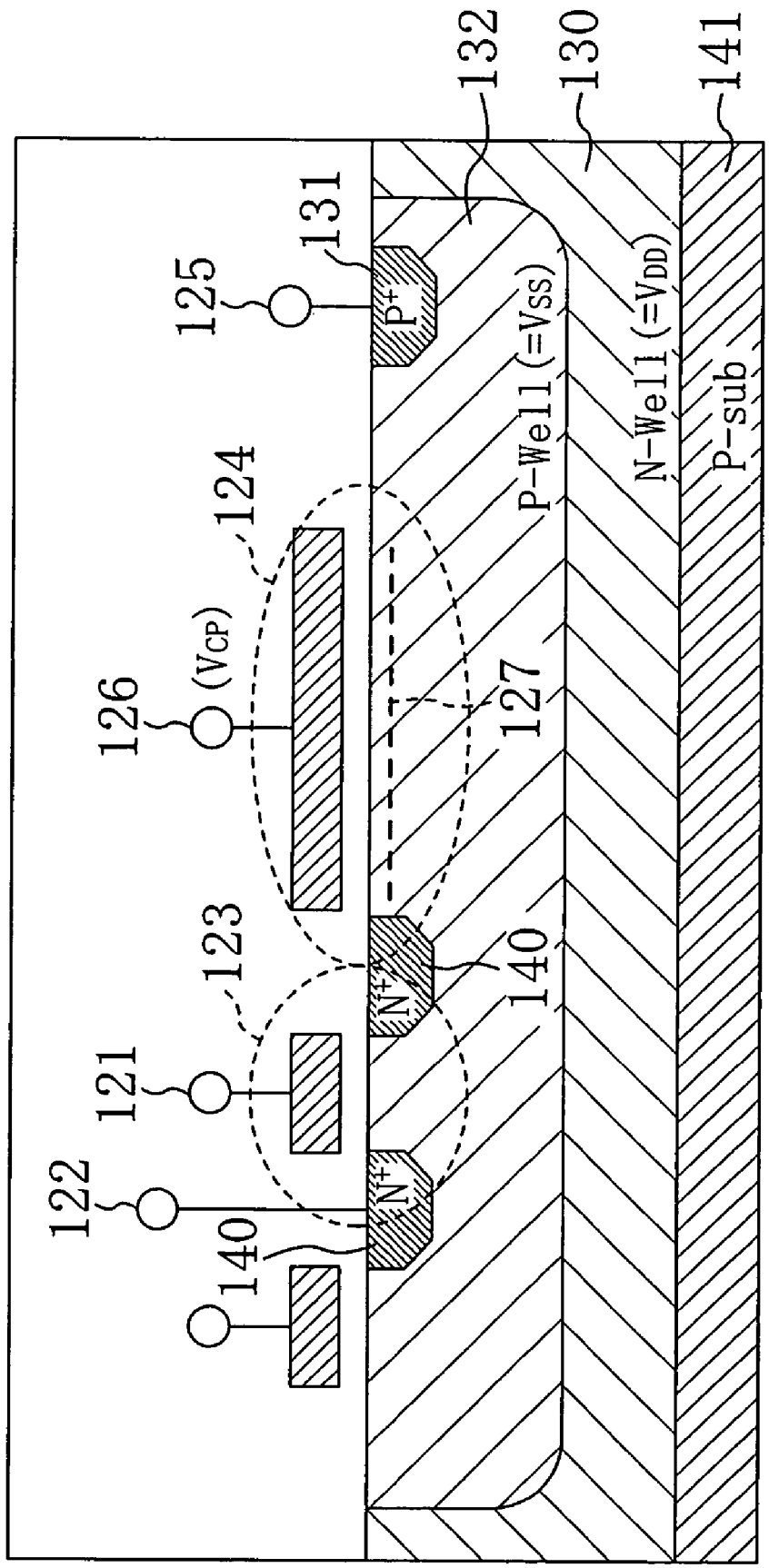
FIG. 13 is a cross-sectional view of a memory cell in the semiconductor memory device of the second embodiment.

FIG. 13 is a cross-sectional view illustrating a structure of the DRAM of this embodiment. As shown in FIG. 13, the DRAM memory cell of this embodiment has almost the same structure as that of the DRAM of the first embodiment, but the conductive type of each layer is reversed.

More specifically, the DRAM memory cell of this embodiment includes a semiconductor substrate 141 made of a p-type silicon, an n-type well 130 formed in the semiconductor substrate 141 by implanting an n-type impurity, a p-type well 132 formed in the n-type well 130 by implanting a p-type impurity, an access Tr 123 which is formed on the p-type well 132 and includes a pair of n-type impurity diffused layers 140, a gate insulation film and a gate electrode, and a cell capacitor 124 which shares one of the pair of p-type impurity diffused layers 140 with the access Tr 123 and includes a gate insulation film and a cell plate electrode 126. Note that a triple well structure in which an n-type well and a p-type well are provided on a p-type substrate is shown here. Furthermore, a structure in which a p-type well is provided on an n-type substrate and a MOSFET is provided on the p-type well may be used. However, it is more preferable to use the triple well structure because influence of noise from a logic circuit section can be reduced in the case of using triple structure.

Next, a circuit diagram illustrating a sense amplifier circuit, a bit line precharging/equalizing circuit, and a column select switch circuit of this embodiment will be briefly described.

Figure 14:
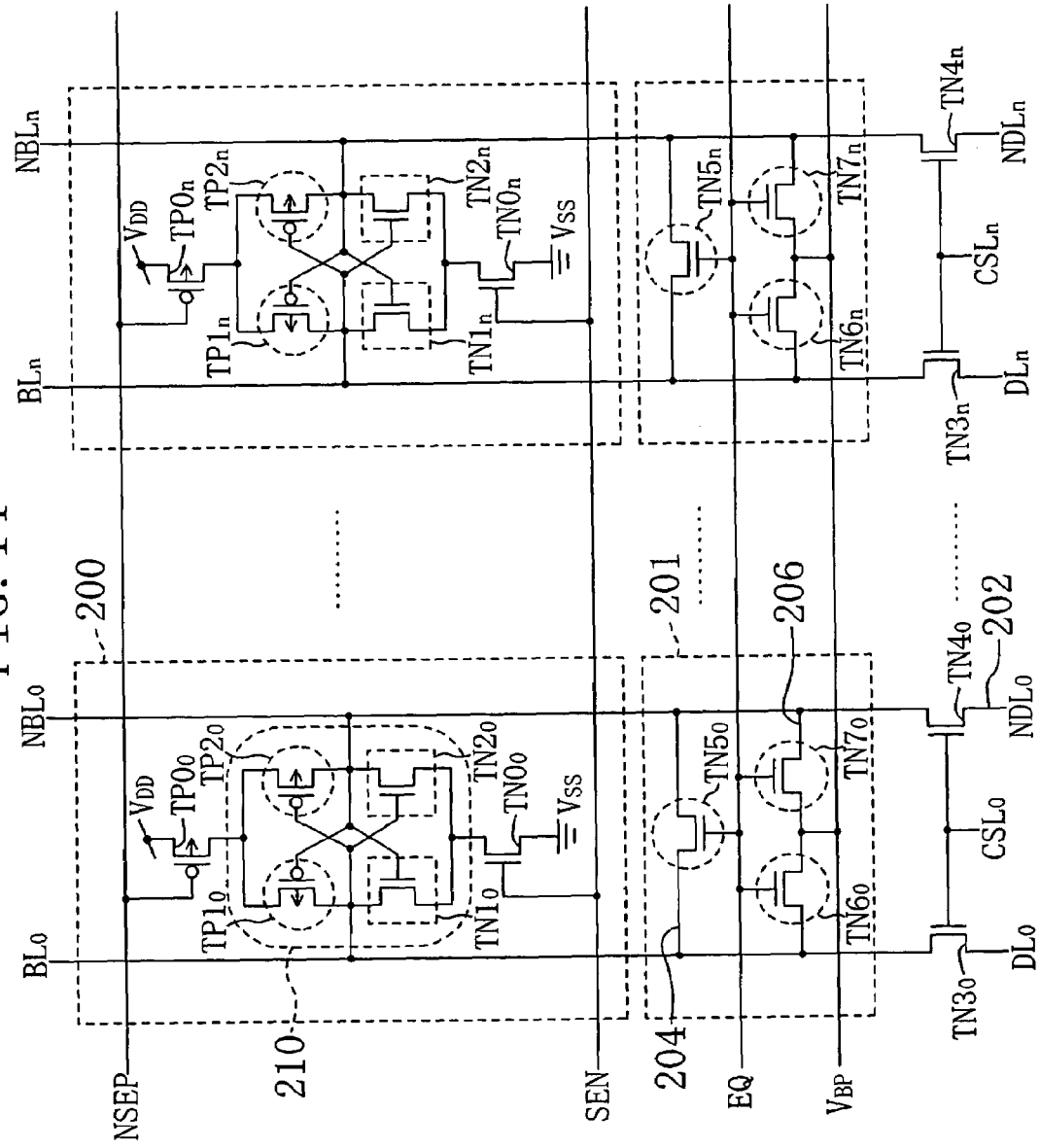
FIG. 14 is a circuit diagram illustrating a sense amplifier circuit, a bit line precharging/equalizing circuit, and a column select switch in the semiconductor memory device of the second embodiment.

FIG. 14 is a circuit diagram illustrating a sense amplifier circuit, a bit line precharging/equalizing circuit, and a column select switch in the DRAM of this embodiment. In the DRAM of this embodiment, the circuit configurations of a sense amplifier circuit 200 and a column select switch 202 are the same as those in the DRAM of the first embodiment. Therefore, description thereof will be omitted.

As shown in FIG. 14, in the bit line precharging/equalizing circuit 201, the bit line equalizing transistor $TP3_0$, the first bit line precharging transistor $TP4_0$ and the second bit line precharging transistor $TP5_0$ are replaced by n-channel MOSFETs, i.e., a bit line equalizing transistor $TN5_0$, a first bit line precharging transistor $TN6_0$ and a second bit line precharging transistor $TN7_0$, respectively. Furthermore, each of the bit line equalizing transistor $TN5_0$ and the first bit line precharging transistor $TN6_0$ and the second bit line precharging transistor $TN7_0$ is formed of a depletion type MOSFET.

Thus, an operation margin can be increased. Therefore, this structure is preferable.

Figure 15:
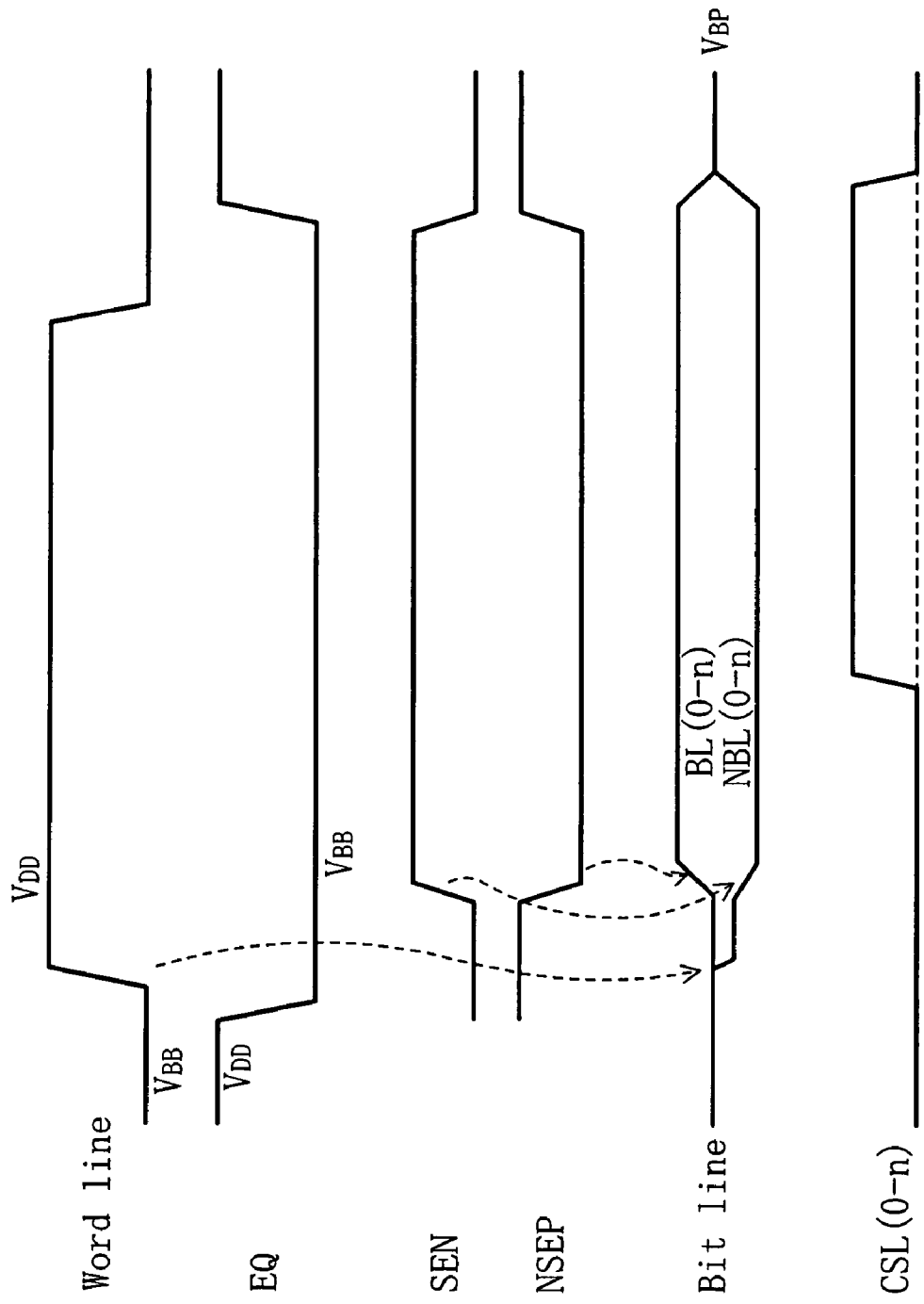
FIG. 15 is a timing chart showing potential changes of each signal, a bit line pair and a word line shown in FIG. 14.
Figure 16:
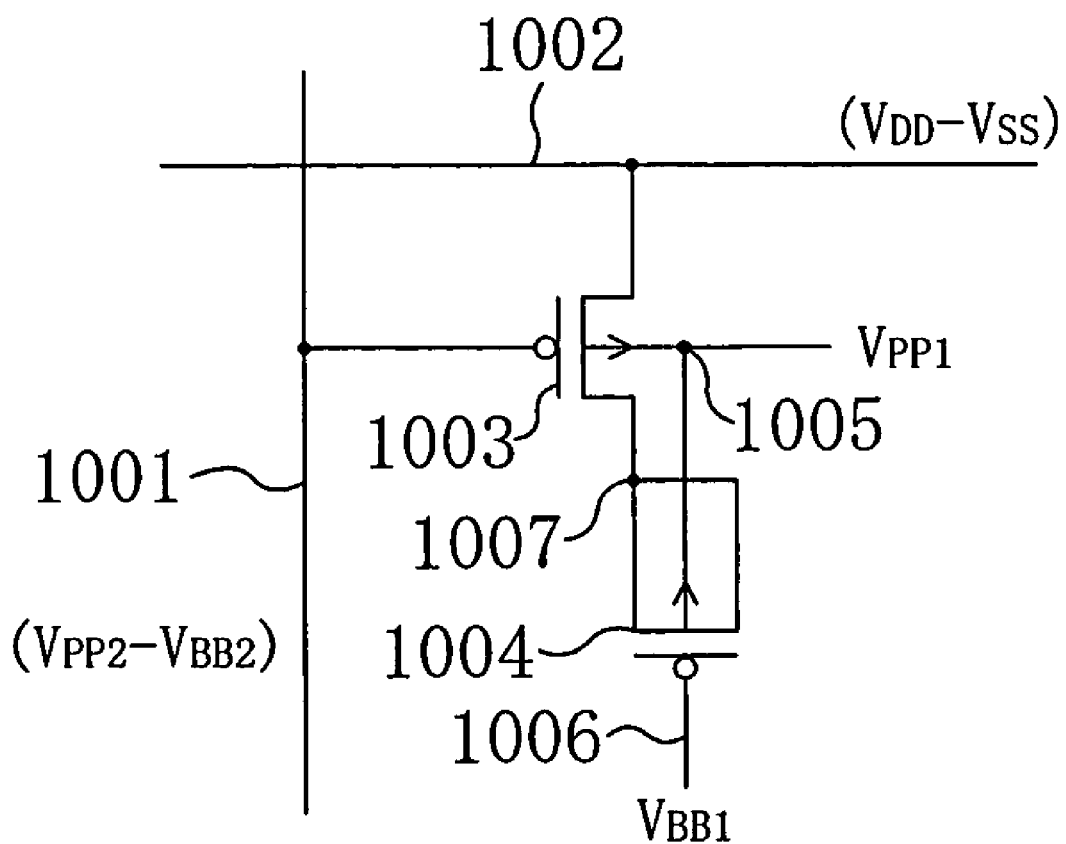
FIG. 16 is a circuit diagram of a memory cell of a general semiconductor device.

FIG. 15 is a timing chart showing potential changes of each signal, a bit line pair and a word line shown in FIG. 14. Specifically, FIG. 15 is a timing chart showing a timing for reading out "0" data.

First, when the semiconductor memory device of this embodiment is in a non-activated state, the potential of the bit line precharging/equalizing signal EQ becomes the "H" level of $V_{DD}$. Then, the n-channel MOSFET constituting the bit line precharging/equalizing circuit becomes conductive, so that the respective potentials of the bit line pairs BL and NBL are precharged. Note that the column select switch 202 is OFF.

Next, when the semiconductor memory device is in an activated state, the bit line precharging/equalizing signal EQ becomes the "L" level and is no longer in a precharged state. At this time, the potential of the bit line precharging/equalizing signal EQ is set at the negative increased potential $V_{BB}$ so that the bit line equalizing transistor $TN3_0$ and the first and second bit line precharging transistors $TN4_0$ and $TN5_0$ are reliably turned OFF.

Thereafter, the potential of the word line selected by a row address changes from $V_{BB}$ to $V_{DD}$. Then, when the word line is activated, data stored in the memory cell is read out as a very small potential difference by the bit line pairs BL and NBL. Subsequently, when the first sense amplifier signal NSEP is changed to the "L" level and the second sense amplifier driving signal SEN is changed to the "H" level, the sense amplifier circuit 200 is activated, so that the very small potential difference read out from the memory cell is amplified. Then, the column select switch selected by a column address is turned ON, so that data is exchanged through the data bus pairs DL and NDL.

Thereafter, to make the semiconductor memory device in a non-operation state, the potential of the word line is first changed from $V_{DD}$ to $V_{BB}$ to be non-activated. In this state, re-write of data on the memory cell provided on the bit line is completed, and then the potential of the bit line precharging/equalizing signal EQ becomes the "H" level again. In this manner, a bit line precharging/equalizing operation is performed to make the device in a stand-by state.

By the above-described operation, the sense amplifier circuit, the bit line precharing/equalizing circuit and the column select switch can drive a memory cell formed of an n-channel MOSFET. Note that the basic configurations of other peripheral circuits are not different from those of the first embodiment. Therefore, description thereof will be omitted.

What is claimed is:
1. A semiconductor memory device comprising:
a word line;
a first bit line intersecting with the word line;

a second bit line forming a bit line pair with the first bit line;

a memory cell including an access transistor of an MISFET in which a gate electrode is connected to the word line and a first doped layer is connected to the first bit line, and a cell capacitor connected to a second doped layer of the access transistor, being capable of storing electric charge, and located at the intersection between the word line and the first bit line; and a sense amplifier for amplifying a potential difference between the first bit line and the second bit line during a read-out operation wherein a positive power supply voltage is applied to the first bit line in a high level state and a ground voltage is applied to the first bit line in a low level state, wherein the access transistor is a depletion type p-channel MISFET, and wherein the ground voltage is applied to a gate electrode of the access transistor through the word line when the memory cell is in an activated state.

2. The semiconductor memory device of claim 1, wherein an increased potential higher than the positive power supply voltage is applied to the gate electrode of the access transistor in a non-activated state.

3. The semiconductor memory device of claim 1, wherein the cell capacitor is a p-channel MISFET.

4. The semiconductor memory device of claim 3, wherein the cell capacitor is a planar type MISFET.

5. The semiconductor memory device of claim 3, wherein the cell capacitor is a depletion type MISFET, and wherein during an operation period, the ground voltage is applied to the gate electrode of the cell capacitor.

6. The semiconductor memory device of claim 1, wherein the access transistor and the cell capacitor share a substrate or an n-type well to which the positive power supply voltage is applied.

7. The semiconductor memory device of claim 1, wherein the sense amplifier includes:

an amplifier circuit which includes a pair of p-channel MISFETs and amplifies a potential difference between the pair of bit lines; and a p-channel drive MIS transistor which controls driving of the amplifier circuit and has a lower threshold voltage than that of the pair of p-channel MISFETs.

8. The semiconductor memory device of claim 7, wherein each of the pair of p-channel MISFETs is a depletion type MISFET.

9. The semiconductor memory device of claim 1, further comprising a precharging/equalizing circuit including:

a bit line equalizing transistor of a depletion type p-channel MISFET for short-circuitting between the first bit line and the second bit line during a period in which the memory cell is in a non-activated state;

a bit line precharging transistor of depletion type p-channel MISFET for applying a constant voltage to the bit line pair during a period in which the memory cell is in a non-activated state.

10. The semiconductor memory device of claim 9, wherein a voltage higher than a threshold voltage is applied to each gate electrode of the bit line equalizing transistor and the bit line precharging transistor during a period in which the memory cell is in a non-activated state.

11. The semiconductor memory device of claim 9, wherein the access transistor, the bit line equalizing transistor, the bit line precharging transistor and the pair of p-channel MISFETs in the sense amplifier are formed in a common process step.

12. A semiconductor memory device comprising:
a word line;
a first bit line intersecting with the word line;
a second bit line forming a bit line pair with the first bit line;

a memory cell including an access transistor of an MISFET in which a gate electrode is connected to the word line and a first doped layer is connected to the first bit line, and a cell capacitor connected to a second doped layer of the access transistor, being capable of storing electric charge, and located at the intersection between the word line and the first bit line; and a sense amplifier for amplifying a potential difference between the first bit line and the second bit line during a read-out operation wherein a positive power supply voltage is applied to the first bit line in a high level state and a ground voltage is applied to the first bit line in a low level state, wherein the access transistor is a depletion type n-channel MISFET, and wherein the positive voltage is applied to a gate electrode of the access transistor through the word line when the memory cell is in an activated state.

13. The semiconductor memory device of claim 12, wherein a negative increased potential lower than the ground voltage is applied to the gate electrode of the access transistor in a non-activated state.

14. The semiconductor memory device of claim 12, wherein the cell capacitor is an n-channel MISFET.

15. The semiconductor memory device of claim 12, wherein the sense amplifier includes:

an amplifier circuit which includes a pair of n-channel MISFETs and amplifies a potential difference between the pair of bit lines; and an n-channel drive MIS transistor which controls driving of the amplifier circuit and has a higher threshold voltage than that of the pair of n-channel MISFETs.

16. A semiconductor integrated circuit device comprising:
a logic circuit which includes a p-channel MISFET and is integrated on a substrate; and a dynamic semiconductor memory device provided on the substrate on which the logic circuit is provided and including a word line, a first bit line intersecting with the word line, a second bit line forming a bit line pair with the first bit line, a memory cell including an access transistor of a p-channel MISFET in which a gate electrode is connected to the word line and a first doped layer is connected to the first bit line, and a cell capacitor connected to a second doped layer of the access transistor, being capable of storing electric charge, and located at the intersection between the word line and the first bit line, and a sense amplifier for amplifying a potential difference between the first bit line and the second bit line during a read-out operation wherein the threshold voltage of the access transistor is set to be higher than that of the p-channel MISFET provided in the logic circuit.

17. The semiconductor integrated circuit device of claim 16, wherein the access transistor is a depletion type MISFET, and wherein the ground voltage is applied to a gate electrode of the access transistor through the word line when the memory cell is in an activated state.

18. The semiconductor integrated circuit device of claim 16, wherein the cell capacitor is a p-channel MISFET.

19. The semiconductor integrated circuit device of claim 18, wherein the cell capacitor is a planar type MISFET.

20. The semiconductor integrated circuit device of claim 16, wherein the cell capacitor is a depletion type MISFET, and
wherein the ground voltage is applied to a gate electrode of the cell capacitor during an operation period.

21. The semiconductor integrated circuit device of claim 17, wherein the access transistor includes a gate insulation film having a greater thickness than the thickness of a gate insulation film of the p-channel MISFET in the logic circuit.

22. The semiconductor integrated circuit device of claim 17, wherein the thickness of the gate insulation film of the access transistor is equal to the thickness of a gate insulation film of the cell capacitor.

23. The semiconductor integrated circuit device of claim 16, wherein the access transistor and the cell capacitor share a substrate or an n-type well to which the positive power supply voltage is applied, and
wherein the positive power supply voltage is applied to the first bit line in a high level state and the ground voltage is applied to the first bit line in a low level state.

24. The semiconductor integrated circuit device of claim 16, wherein the sense amplifier includes:
an amplifier circuit which includes a pair of p-channel MISFETs and amplifies a potential difference between the pair of bit lines; and
a p-channel drive MIS transistor which controls driving of the amplifier circuit and has a lower threshold voltage than that of the pair of p-channel MISFETs.

25. The semiconductor integrated circuit device of claim 24, wherein each of the pair of p-channel MISFETs is a depletion type MISFET.

26. The semiconductor integrated circuit device of claim 24, wherein the dynamic semiconductor memory device further includes a precharging/equalizing circuit including:
a bit line equalizing transistor of a depletion type p-channel MISFET for short-circuitting between the first bit line and the second bit line during a period in which the memory cell is in a non-activated state; and
a bit line precharging transistor of a depletion type p-channel MISFET for applying a constant voltage to the bit line pair during a period in which the memory cell is in a non-activated state.

27. The semiconductor integrated circuit device of claim 26, wherein a voltage higher than a threshold voltage is applied to each gate electrode of the bit line equalizing transistor and the bit line precharging transistor during a period in which the memory cell is in a non-activated state.

28. The semiconductor integrated circuit device of claim 16, wherein the dynamic semiconductor memory device is formed by the same logic process used for the logic circuit.

29. A semiconductor integrated circuit device comprising:
a logic circuit which includes a n-channel MISFET and is integrated on a substrate; and
a dynamic semiconductor memory device provided on the substrate on which the logic circuit is provided and including a word line, a first bit line intersecting with the word line, a second bit line forming a bit line pair with the first bit line, a memory cell including an access transistor of an n-channel MISFET in which a gate electrode is connected to the word line and a first doped layer is connected to the first bit line, and a cell capacitor connected to a second doped layer of the access transistor, being capable of storing electric charge, and located at the intersection between the word line and the first bit line, and a sense amplifier for amplifying a potential difference between the first bit line and the second bit line during a read-out operation
wherein the threshold voltage of the access transistor is set to be lower than the threshold voltage of the n-channel MISFET provided in the logic circuit.

30. The semiconductor integrated circuit device of claim 29, wherein the access transistor is a depletion type MISFET, and
wherein a positive power supply voltage is applied to a gate electrode of the access transistor through the word line when the memory cell is in an activated state.

31. The semiconductor integrated circuit device of claim 29, wherein the cell capacitor is an n-channel MISFET.

32. The semiconductor integrated circuit device of claim 29, wherein the sense amplifier includes:
an amplifier circuit which includes a pair of n-channel MISFETs and amplifies a potential difference between the pair of bit lines; and
an n-channel drive MIS transistor which controls driving of the amplifier circuit and has a higher threshold voltage than that of the pair of n-channel MISFETs.

* * * * *